(12) United States Patent
Park et al.

(10) Patent No.: US 12,334,543 B2
(45) Date of Patent: Jun. 17, 2025

(54) ELECTRODE STRUCTURE AND MANUFACTURING METHOD THEREOF

(71) Applicant: INDUSTRY-UNIVERSITY COOPERATION FOUNDATION HANYANG UNIVERSITY ERICA CAMPUS, Ansan-Si (KR)

(72) Inventors: Tae Joo Park, Ansan-si (KR); Dae Woong Kim, Ansan-si (KR); Kyu Moon Kwon, Ansan-si (KR)

(73) Assignee: INDUSTRY-UNIVERSITY COOPERATION FOUNDATION HANYANG UNIVERSITY ERICA CAMPUS, Ansan-si (KR)

( * ) Notice: Subject to any disclaimer, the term of this patent is extended or adjusted under 35 U.S.C. 154(b) by 665 days.

(21) Appl. No.: 17/593,089

(22) PCT Filed: Mar. 30, 2020

(86) PCT No.: PCT/KR2020/004367
§ 371 (c)(1),
(2) Date: Sep. 9, 2021

(87) PCT Pub. No.: WO2020/204551
PCT Pub. Date: Oct. 8, 2020

(65) Prior Publication Data
US 2022/0190318 A1 Jun. 16, 2022

(30) Foreign Application Priority Data
Mar. 29, 2019 (KR) .................. 10-2019-0036771

(51) Int. Cl.
*H01M 4/1395* (2010.01)
*C23C 16/455* (2006.01)
(Continued)

(52) U.S. Cl.
CPC ..... *H01M 4/1395* (2013.01); *C23C 16/45555* (2013.01); *H01M 4/0404* (2013.01);
(Continued)

(58) Field of Classification Search
CPC .. H01M 4/0471; H01M 4/134; H01M 10/052; H01M 4/0423
(Continued)

(56) References Cited

U.S. PATENT DOCUMENTS 9,780,172 B2 10/2017 Kim et al.
10,265,773 B2 4/2019 Um et al.
(Continued)

FOREIGN PATENT DOCUMENTS

KR 10-2014-0004645 A 1/2014
KR 10-1353262 B1 1/2014
(Continued)

OTHER PUBLICATIONS

Deposition, Oct. 20, 2020, University of Houston Nanofabrication Facility (UNHF), p. 2 (Year: 2020).*
(Continued)

*Primary Examiner* — Jonathan G Leong
*Assistant Examiner* — John S Medley
(74) *Attorney, Agent, or Firm* — Finch & Maloney PLLC

(57) ABSTRACT

A method for manufacturing an electrode structure is provided. The method for manufacturing an electrode structure comprises the steps of: preparing a base substrate; forming an amorphous seed layer covering the base substrate; crystallizing the seed layer; and covering the crystallized seed layer and forming a functional film for a secondary battery inherently having a crystalline structure.

12 Claims, 30 Drawing Sheets

(51) Int. Cl.
*H01M 4/04* (2006.01)
*H01M 4/134* (2010.01)
*H01M 10/052* (2010.01)
*H01M 4/02* (2006.01)

(52) U.S. Cl.
CPC ....... *H01M 4/0428* (2013.01); *H01M 4/0471* (2013.01); *H01M 4/134* (2013.01); *H01M 10/052* (2013.01); *H01M 2004/021* (2013.01)

(58) Field of Classification Search
USPC .......................................................... 429/218
See application file for complete search history.

(56) References Cited

U.S. PATENT DOCUMENTS

| | | | |
|---|---|---|---|
| 10,847,845 B2 | 11/2020 | Kim et al. | |
| 2010/0285356 A1* | 11/2010 | Choi | H01M 4/0435 156/60 |
| 2011/0254128 A1* | 10/2011 | Kuriki | H01L 29/045 257/532 |
| 2011/0292564 A1* | 12/2011 | Yamazaki | H01G 11/86 361/301.4 |
| 2012/0037846 A1* | 2/2012 | Lee | H01M 4/485 252/182.1 |
| 2012/0295169 A1 | 11/2012 | Hosoe et al. | |
| 2013/0216849 A1* | 8/2013 | Matsunaga | C25D 1/08 428/596 |
| 2014/0272560 A1* | 9/2014 | Huang | C23C 14/08 427/126.6 |
| 2018/0261837 A1* | 9/2018 | Yoo | H01M 4/38 |
| 2019/0341601 A1* | 11/2019 | Park | H01M 10/4235 |
| 2019/0379056 A1* | 12/2019 | Chen | H01M 10/052 |
| 2020/0106131 A1* | 4/2020 | Takano | H01M 50/434 |

FOREIGN PATENT DOCUMENTS

| | | | | |
|---|---|---|---|---|
| KR | 10-2014-0098013 A | | 8/2014 | |
| KR | 10-1455263 B1 | | 10/2014 | |
| KR | 10-2016-0126279 A | | 11/2016 | |
| KR | 10-2018-0025685 A | | 3/2018 | |
| KR | 20180138546 A | * | 12/2018 | .......... H01M 10/052 |
| KR | 10-2020-0030969 A | | 3/2020 | |
| WO | WO-2019044901 A1 | * | 3/2019 | ............. C01B 33/12 |

OTHER PUBLICATIONS

Chapter 8 Annealing, Dec. 8, 2017, National Dong Hwa University (NDHU), p. 10 (Year: 2017).*
Han et al., "Atomic layer deposition of cobalt oxide thin films using cyclopentadienylcobalt dicarbonyl and ozone at low temperatures", J. Vac. Sci. Technol. A 31(1) (Dec. 19, 2012).
Maximov et al., "Atomic Layer Deposition of Li—Me—O Thin Films as Electrode Materials for Nanodevices Power Sources", Proceedings of the 1st International Online Conference on Nanomaterials, 3(1), 9 (Aug. 30, 2018).
Donders et al., "Atomic layer deposition of LiCoO2 thin film electrodes for all-solid-state Li-ion micro-batteries", Journal of the Electrochemical Society, 160(5), pp. A3066-A3071 (2013).
Written Opinion dated Jul. 8, 2020 for International Patent Application No. PCT/KR2020/004367, 5 pages.
International Search Report mailed Jul. 8, 2020 for International Patent Application No. PCT/KR2020/004367, 3 pages.

* cited by examiner

Fig. 2
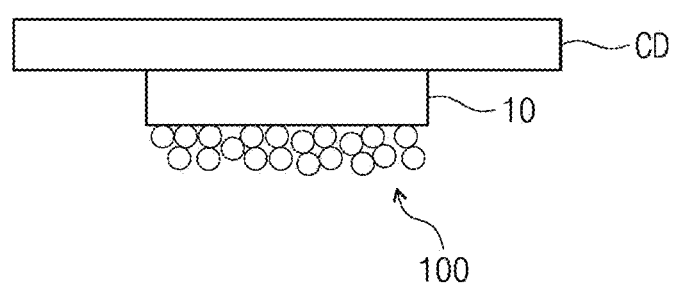
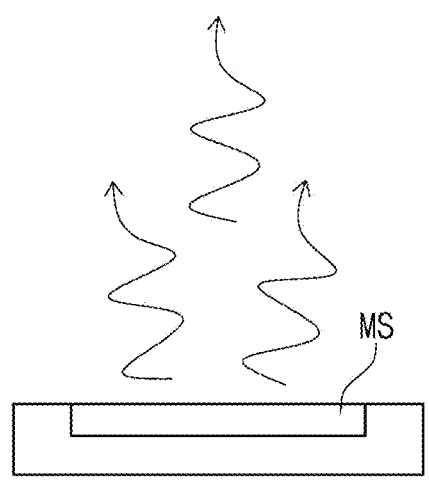

Fig. 14
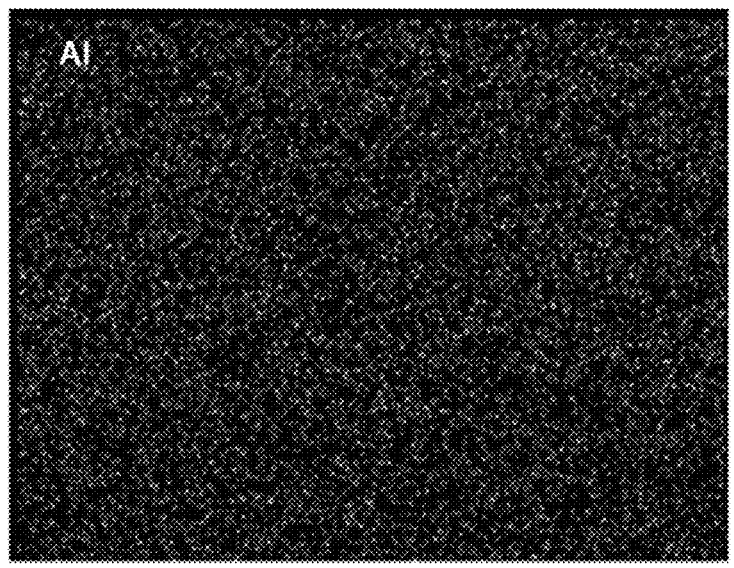
(a)
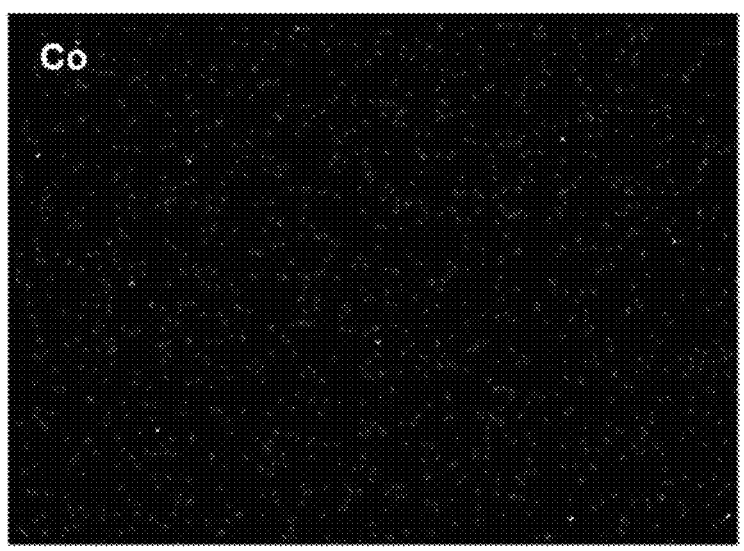
(b)
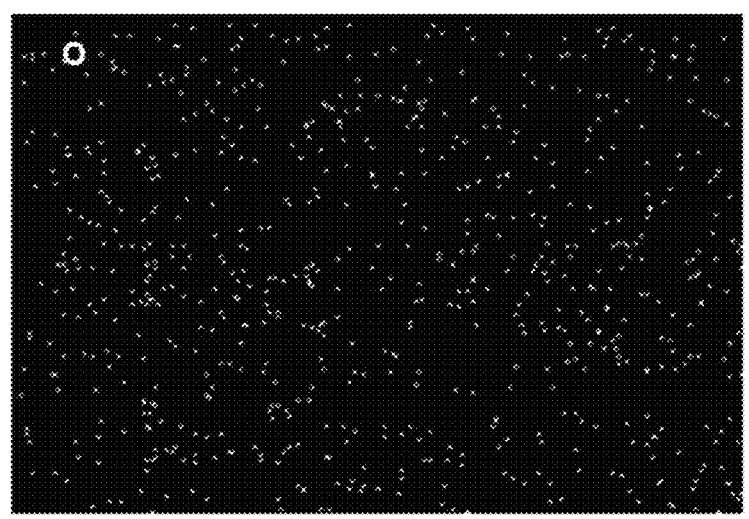
(c)

Fig. 18
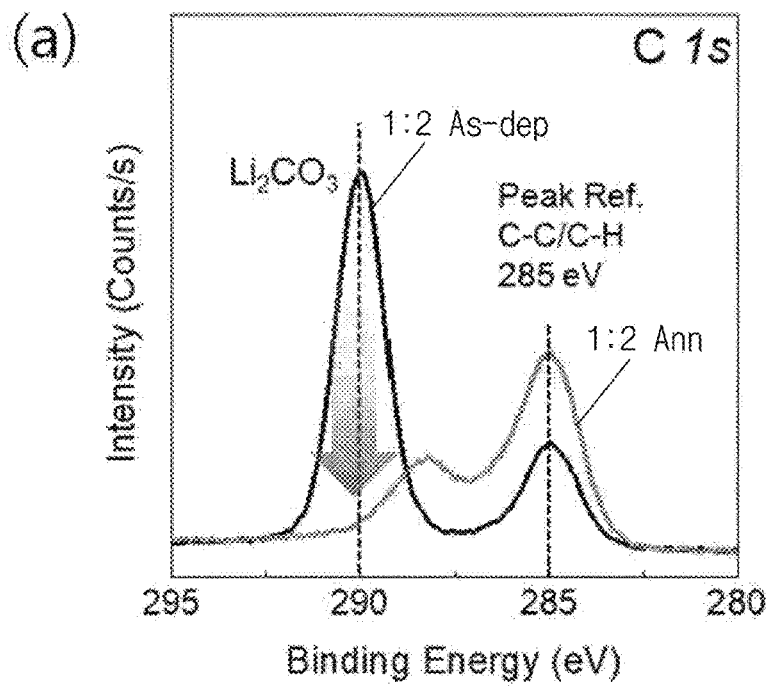
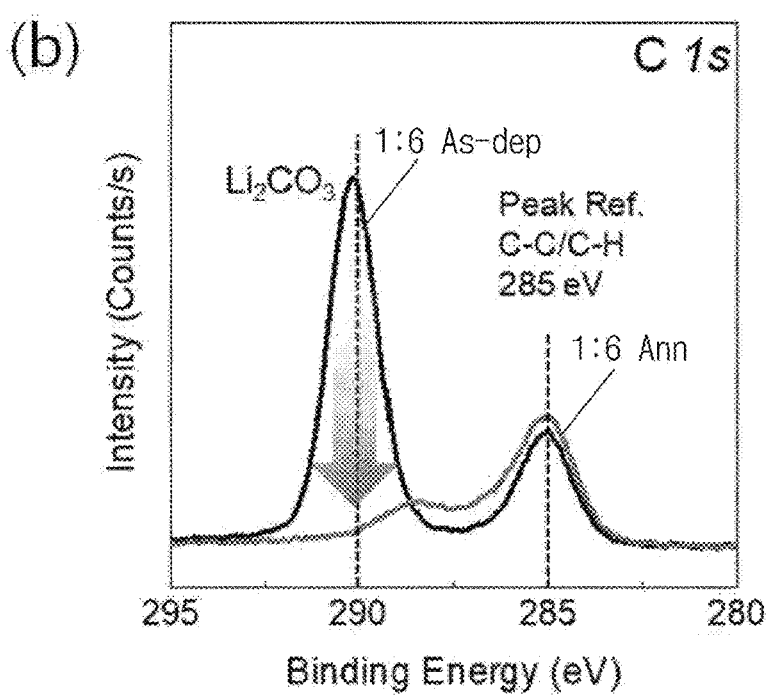

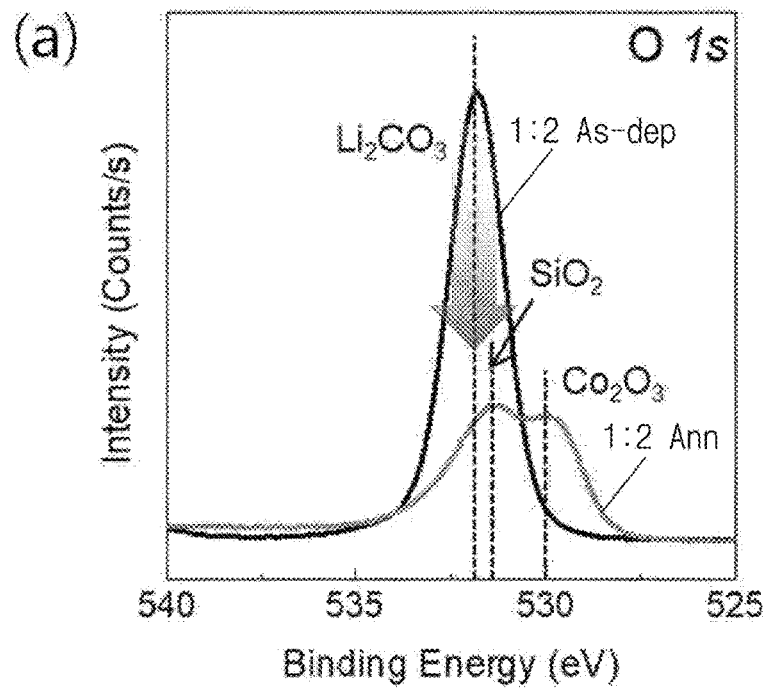
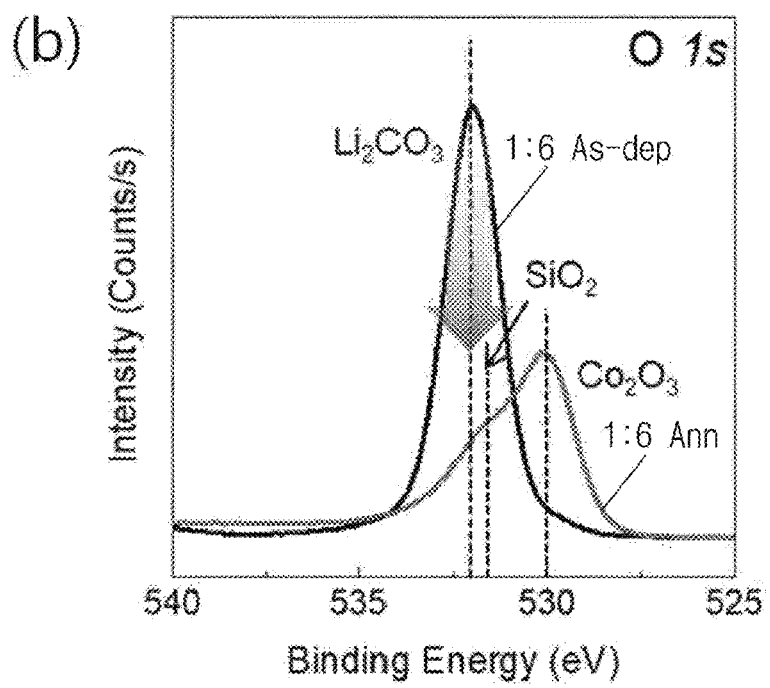
Fig. 19

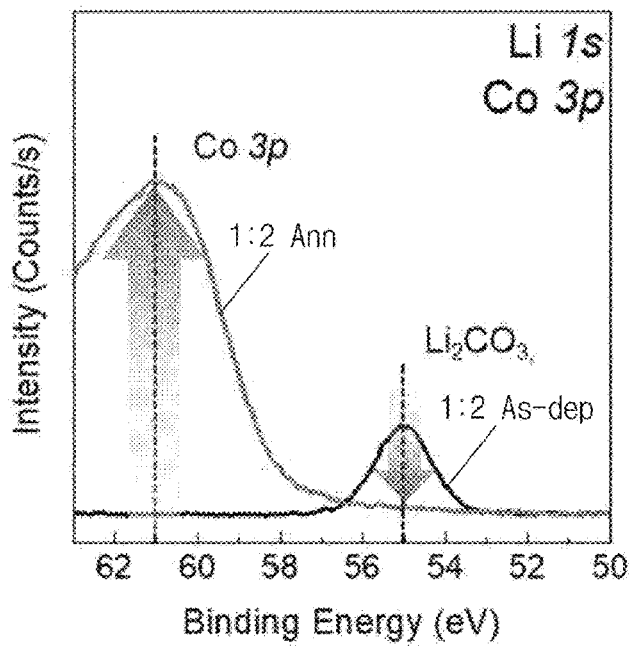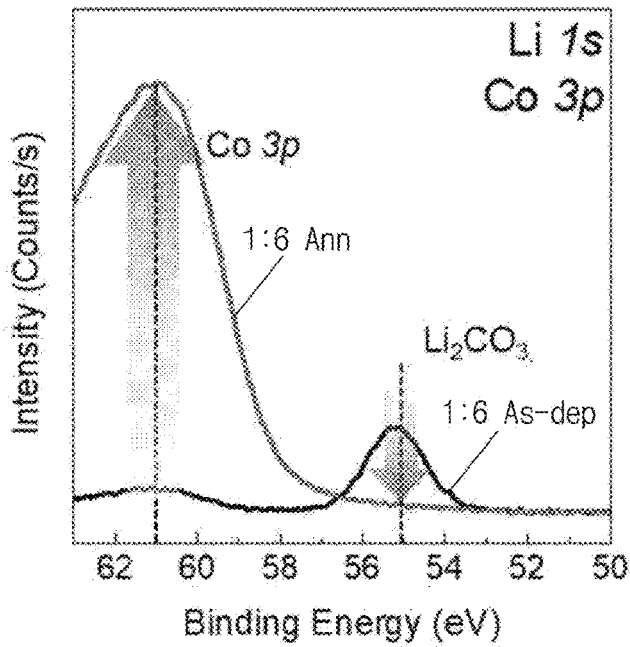
Fig. 20

Fig. 24
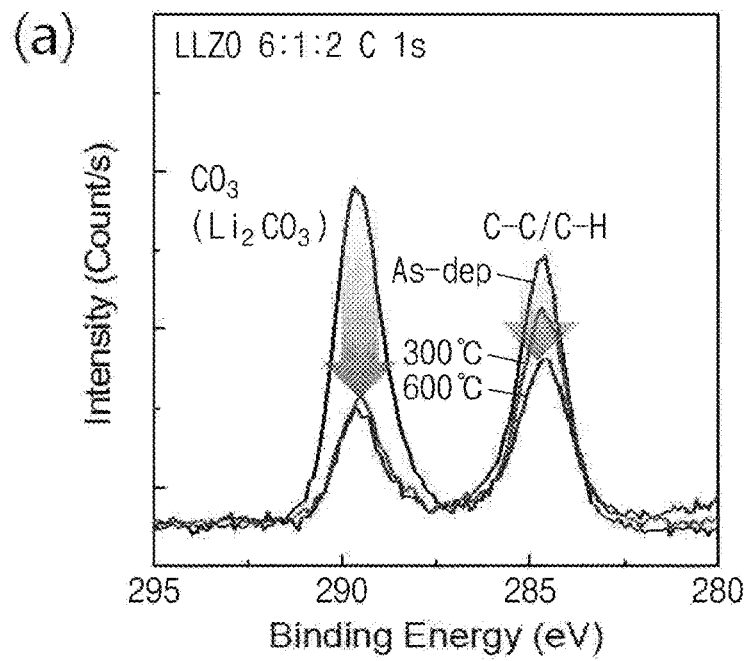
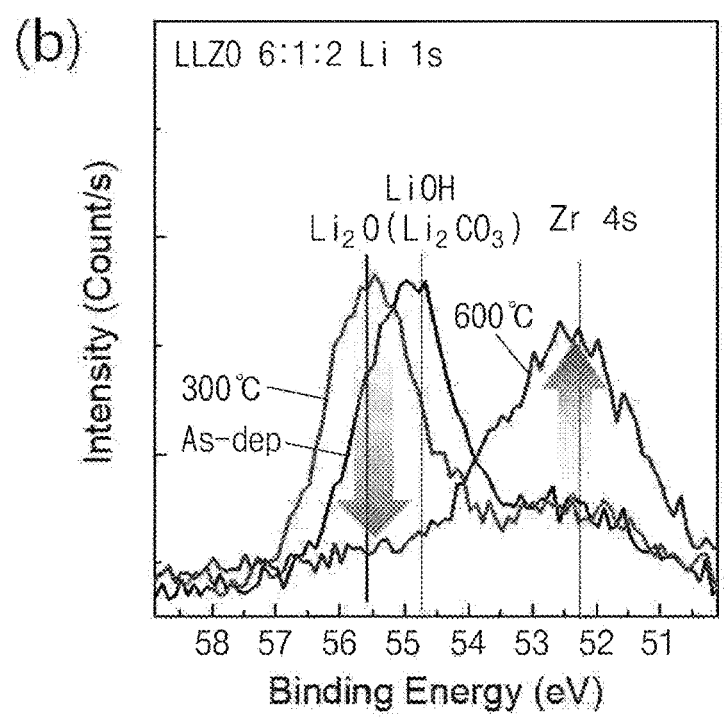

Fig. 27
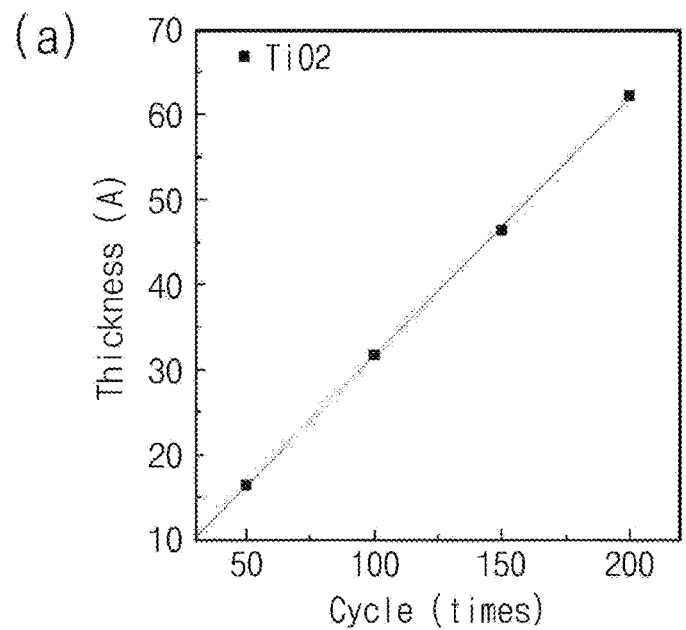
(a)
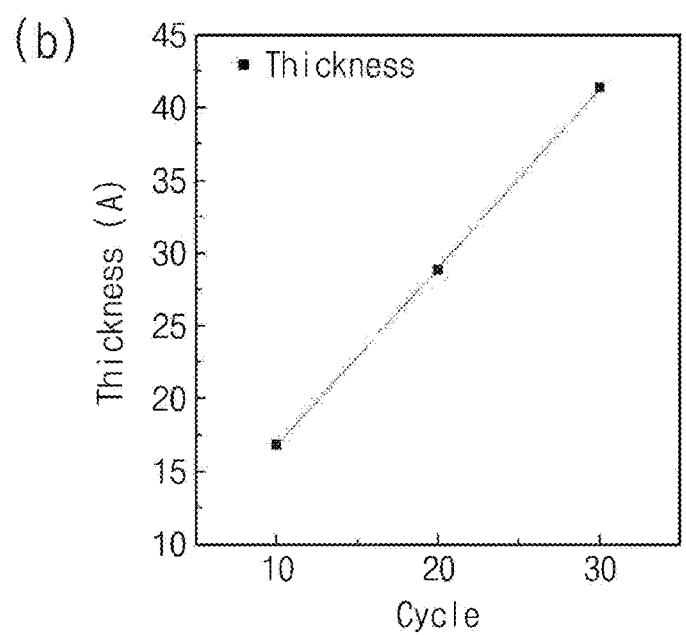
(b)

Fig. 28
(a)
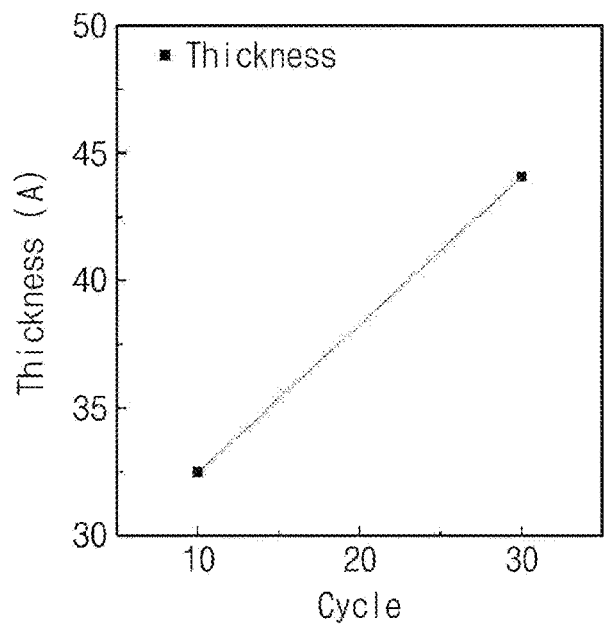
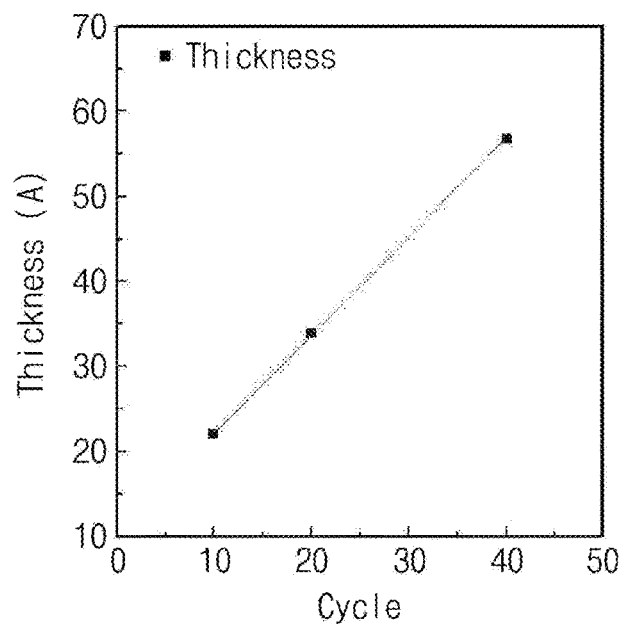

Fig. 30
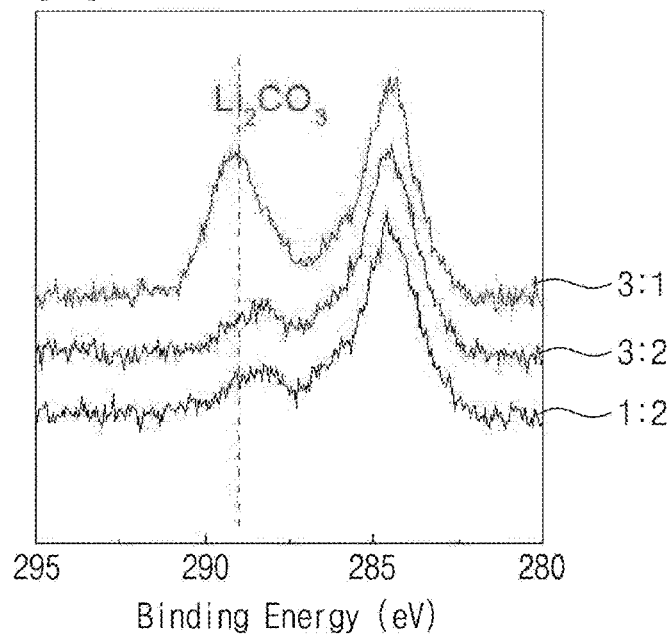
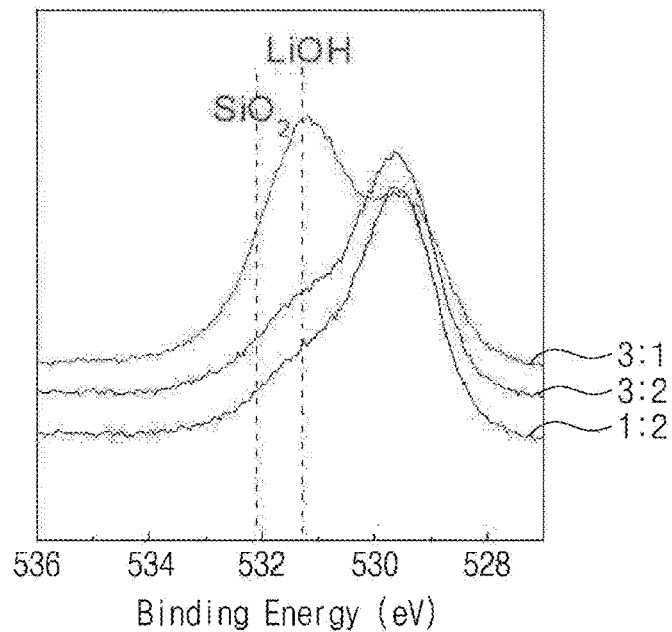

ELECTRODE STRUCTURE AND MANUFACTURING METHOD THEREOF

TECHNICAL FIELD

The present disclosure relates to an electrode structure and a manufacturing method thereof, and more particularly, to an electrode structure and a manufacturing method thereof, capable of forming a functional film having a crystalline structure from a seed layer.

BACKGROUND ART

Batteries are broadly divided into physical batteries and chemical batteries, and generally, a battery is a common term for the chemical battery. The chemical batteries are subdivided into primary batteries (normal dry batteries) and secondary batteries, in which the primary battery refers to a battery that is used once and discarded, and the secondary battery refers to a battery that is used semi-permanently through charging. From portable electronic devices such as laptop computers, mobile communication terminals, camcorders, and digital cameras to large devices, the secondary batteries, which are expected to have various application fields and a large amount of demand, have been rapidly growing as one of three major component industries of the $21^{st}$ century together with semiconductors and displays.

Recently, battery technology has made technological advances such as a high output, high performance, a light weight, miniaturization, and reliability improvement. In particular, a market for small secondary batteries has been rapidly growing owing to high performance and characterization of portable electronic devices, and expansion of distribution. With regard to the small secondary batteries, conventional nickel-cadmium batteries have begun to be replaced with nickel-hydride batteries and lithium-ion batteries, and a lithium polymer battery obtained by replacing only an electrolyte with a polymer in the lithium-ion battery has been recently spotlighted as a new substitute product. The chemical battery refers to a device for converting chemical energy of a chemical substance provided inside a battery into electrical energy through an electrochemical oxidation-reduction reaction.

In particular, the secondary battery is a rechargeable battery that may be continuously used through recharging after being used once in terms of energy conversion thereof, in which materials are combined such that a process of oxidizing/reducing a substance by a flow of a current, and generating electricity by the oxidation/reduction of the substance may be repeatedly performed. With regard to an operating principle through the lithium-ion battery that is one of the secondary batteries, lithium ions (Li+) that are present in an ionic state move from a positive electrode to a negative electrode during charging, and move from the negative electrode to the positive electrode during discharge so as to generate electricity. In the case of the secondary batteries, with full-scale mass production of nickel-hydride batteries (1991), lithium-ion batteries (1992), and lithium polymer batteries (1999), a development speed and a technological innovation cycle of a new battery system have been progressing very rapidly by the 1990s.

For example, Korean Unexamined Patent Publication No. 10-2020-0030969 (Application Number: 10-2018-0109839, Applicant: LG Chem Ltd.) discloses an electronic device including: a secondary battery including an electrode assembly including an electrode and a separator, and a case for accommodating the electrode assembly; and a driving unit driven by receiving a power from the secondary battery, wherein the secondary battery surrounds at least a portion of an outer periphery of the driving unit.

DISCLOSURE

Technical Problem

One technical object of the present disclosure is to provide an electrode structure and a manufacturing method thereof, capable of reducing an interface resistance.

Another technical object of the present disclosure is to provide an electrode structure and a manufacturing method thereof, capable of reducing surface deterioration.

Still another technical object of the present disclosure is to provide an electrode structure and a manufacturing method thereof, capable of improving a lifespan and a capacity.

Yet another technical object of the present disclosure is to provide an electrode structure and a manufacturing method thereof, capable of improving charging/discharging characteristics.

Still yet another technical object of the present disclosure is to provide an electrode structure and a manufacturing method thereof, capable of achieving a long lifespan.

Another technical object of the present disclosure is to provide an electrode structure and a manufacturing method thereof, which use a semiconductor process.

The technical objects of the present application are not limited to the objects described above.

Technical Solution

In order to achieve the technical objects described above, the present disclosure provides a method of manufacturing an electrode structure.

According to one embodiment, the method of manufacturing the electrode structure includes: preparing a base substrate; forming an amorphous seed layer covering the base substrate; crystallizing the seed layer; and forming a functional film for a secondary battery, which covers the crystallized seed layer and inherently has a crystalline structure.

According to one embodiment, after the preparing of the base substrate and before the forming of the amorphous seed layer, the method of manufacturing the electrode structure may further include providing a reducing metal precursor on the base substrate to remove a native oxide film formed on the base substrate.

According to one embodiment, the reducing metal may remain on a surface of the base substrate from which the native oxide film is removed.

According to one embodiment, after the crystallizing of the seed layer and before the forming of the functional film for the secondary battery, the method of manufacturing the electrode structure may further include providing a reducing metal precursor on the crystallized seed layer to remove a native oxide film formed on the crystallized seed layer.

According to one embodiment, the reducing metal precursor may remain on a surface of the seed layer from which the native oxide film is removed.

According to one embodiment, the reducing metal precursor may include trimethylaluminium (TMA).

According to one embodiment, the crystallizing of the seed layer may include: covering the seed layer with a barrier sheet; and annealing the seed layer covered with the barrier sheet, and the barrier sheet may be configured to reduce a leakage of a metal inside the seed layer to an outside of the seed layer while performing the annealing.

According to one embodiment, the forming of the seed layer may be performed in a chamber, and the crystallizing of the seed layer may be performed in a furnace, a native by-product layer may be formed on the seed layer in a process of transferring the seed layer from the chamber to the furnace, and the native by-product layer may be removed as the seed layer is annealed.

According to one embodiment, the native by-product layer may include a compound of a metal, carbon, and oxygen.

According to one embodiment, the forming of the seed layer may include: providing a first precursor including a first metal on the base substrate, and providing a first reaction source on the base substrate on which the first precursor is provided to form a first seed layer obtained by allowing the first precursor and the first reaction source to react with each other; and providing a second precursor including a second metal on the first seed layer, and providing a second reaction source on the first seed layer on which the second precursor is provided to form a second seed layer obtained by allowing the second precursor and the second reaction source to react with each other.

According to one embodiment, each of the first metal and the second metal may include one of lithium (Li), cobalt (Co), lanthanum (La), zirconium (Zr), or titanium (Ti).

In order to achieve the technical objects described above, the present disclosure provides an electrode structure.

According to one embodiment, the electrode structure includes: a base substrate; and a material film for a secondary battery, which covers a surface of the base substrate, wherein a reducing metal is provided between the surface of the base substrate and the material film or provided within the material film, and the reducing metal has a higher oxygen affinity than a metal included in the material film.

According to one embodiment, the material film may include a first region and a second region, which have mutually different degrees of crystallinity, and the first region may be disposed between the second region and the base substrate.

According to one embodiment, the degree of crystallinity of the first region may be higher than the degree of crystallinity of the second region.

According to one embodiment, the reducing metal may include aluminium (Al).

According to one embodiment, the material film for the secondary battery may include one of a positive electrode, a negative electrode, or a solid electrolyte for a secondary battery.

According to another embodiment, the electrode structure includes: a base substrate; a seed layer covering a surface of the base substrate and having a crystalline structure; and a functional film for a secondary battery, which covers the seed layer and has a crystalline structure, wherein an interface is provided between the seed layer and the functional film.

According to another embodiment, the interface between the seed layer and the functional film may be observed through a scanning electron microscopy (SEM) or transmission electron microscopy (TEM) image.

According to another embodiment, the base substrate may include a porous structure.

Advantageous Effects

According to an embodiment of the present invention, the method of manufacturing the electrode structure may include: preparing a base substrate; forming an amorphous seed layer covering the base substrate; crystallizing the seed layer; and forming a functional film for a secondary battery, which covers the crystallized seed layer and inherently has a crystalline structure. Accordingly, surface deterioration of the functional film can be prevented, so that a lifespan, a capacity, and performance of the electrode structure can be improved. Accordingly, charging/discharging characteristics and lifespan characteristics of a secondary battery including the electrode structure can be improved.

In addition, the seed layer and the functional film may be manufactured by a thin film process using a semiconductor process. Accordingly, an electrode structure for a secondary battery, which has a nano-thickness level and flexibility, can be provided.

Further, according to one embodiment, the base substrate may have a porous structure, and the seed layer and the functional film may conformally cover inner surfaces of pores of the base substrate. Accordingly, surface areas of the seed layer and the functional film can be increased. As a result, an electrode structure capable of implementing a fast charging/discharging speed, a thinner functional film thickness, a low interface resistance, and high ion conductivity can be provided.

DESCRIPTION OF DRAWINGS

FIG. 2 is a view for describing a step of preparing a base substrate in the method of manufacturing the electrode structure according to the embodiment of the present invention.

FIGS. 13 and 14 are SEM-EDS mapping photographs corresponding to plan views of the electrode structure according to Experimental Example of the present invention.

FIGS. 18 to 21 are X-ray photoelectron spectroscopy (XPS) graphs for comparing compositions of the material films according to Example 1 and Comparative Example 1 of the present invention.

FIGS. 24 and 25 are XPS graphs for comparing compositions of material films according to Example 2 and Comparative Example 2 of the present invention.

FIGS. 27 and 28 are graphs for comparing deposition rates of material films according to Example 3 and Comparative Example 3 of the present invention.

FIGS. 29 and 30 are XPS graphs for comparing compositions of material films according to Examples 3-1 to 3-3 of the present invention.

BEST MODE

Figure 1:
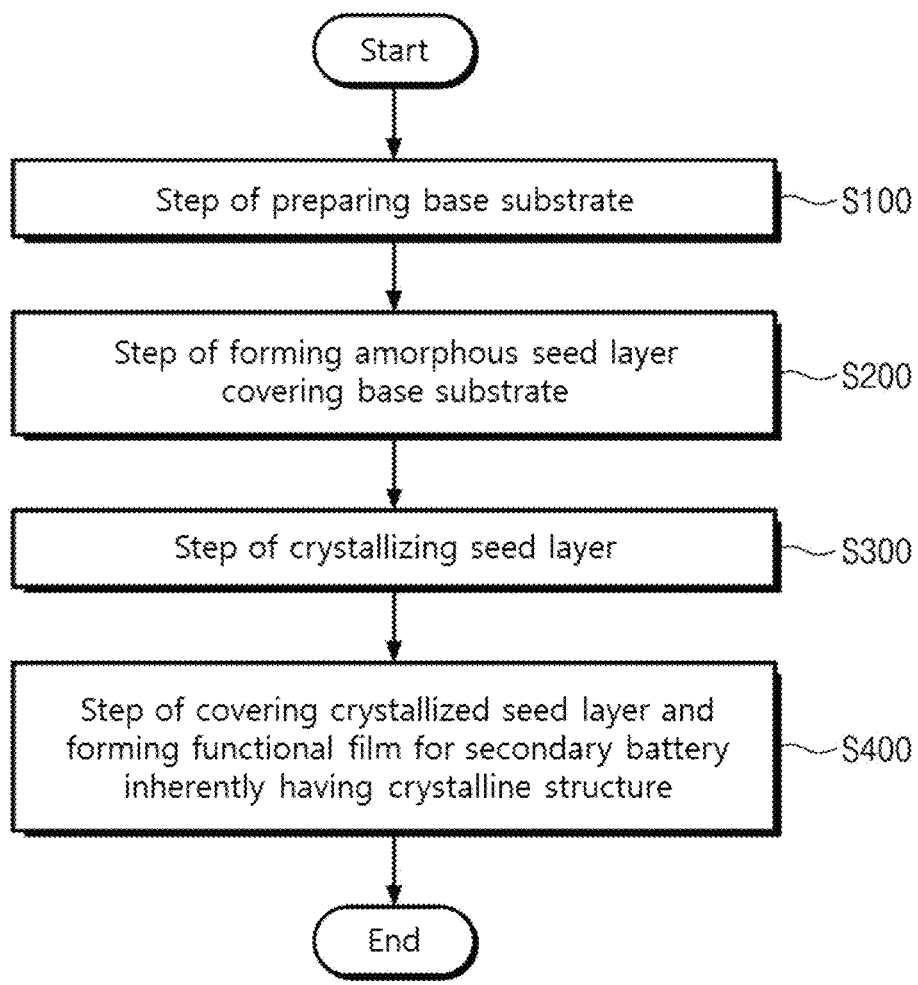
FIG. 1 is a flowchart for describing a method of manufacturing an electrode structure according to an embodiment of the present invention.

Hereinafter, exemplary embodiments of the present invention will be described in detail with reference to the accompanying drawings. However, the technical idea of the present invention is not limited to the embodiments described herein, but may be realized in different forms. The embodiments introduced herein are provided to sufficiently deliver the idea of the present invention to those skilled in the art so that the disclosed contents may become thorough and complete.

When it is mentioned in the present disclosure that one element is on another element, it means that one element may be directly formed on another element, or a third element may be interposed between one element and another element. Further, in the drawings, thicknesses of films and areas are exaggerated for efficient description of the technical contents.

In addition, in the various embodiments of the present disclosure, the terms such as first, second, and third are used to describe various elements, but the elements are not limited to the terms. The terms are used only to distinguish one element from another element. Therefore, an element mentioned as a first element in one embodiment may be mentioned as a second element in another embodiment. The embodiments described and illustrated herein include their complementary embodiments. Further, the term "and/or" used herein is used to include at least one of the elements enumerated before and after the term.

As used herein, the terms of a singular form may include plural forms unless the context clearly indicates otherwise. Further, the terms such as "including" and "having" are used to designate the presence of features, numbers, steps, elements, or combinations thereof described in the present disclosure, and shall not be construed to preclude any possibility of the presence or addition of one or more other features, numbers, steps, elements, or combinations thereof.

Further, in the following description of the present invention, detailed descriptions of known functions and configurations incorporated herein will be omitted when they may make the subject matter of the present invention unnecessarily unclear.

Figure 3:
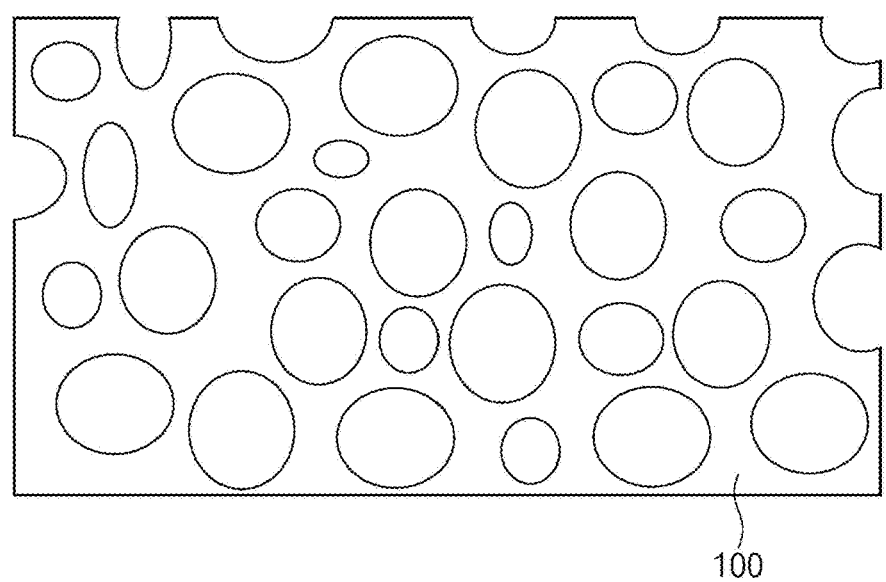
FIG. 3 is a view showing a base substrate used in the method of manufacturing the electrode structure according to the embodiment of the present invention.
Figure 4:
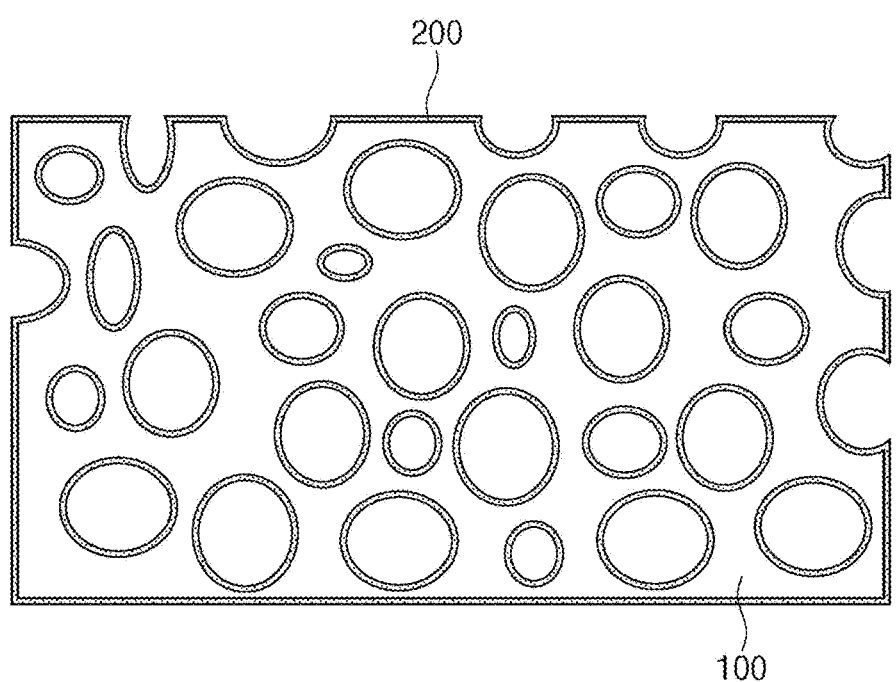
FIG. 4 is a view showing an amorphous seed layer covering the base substrate.
Figure 5:
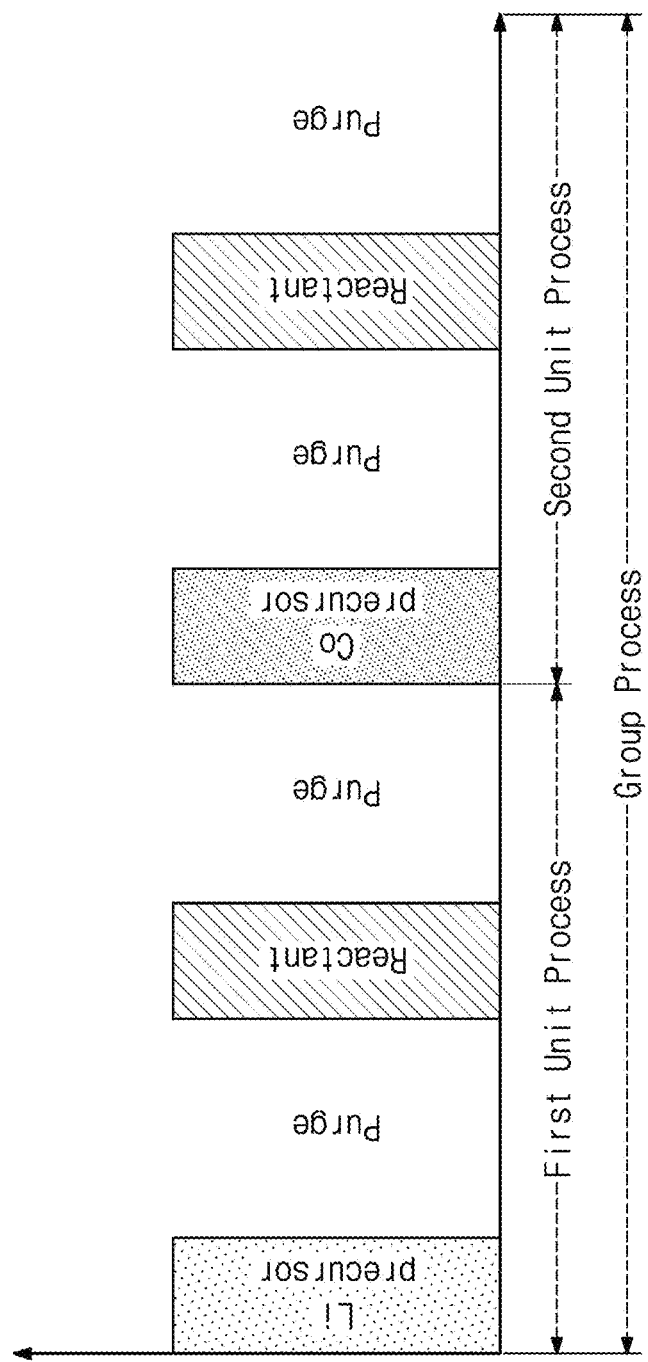
FIG. 5 is a view specifically showing a process of manufacturing the seed layer.
Figure 6:
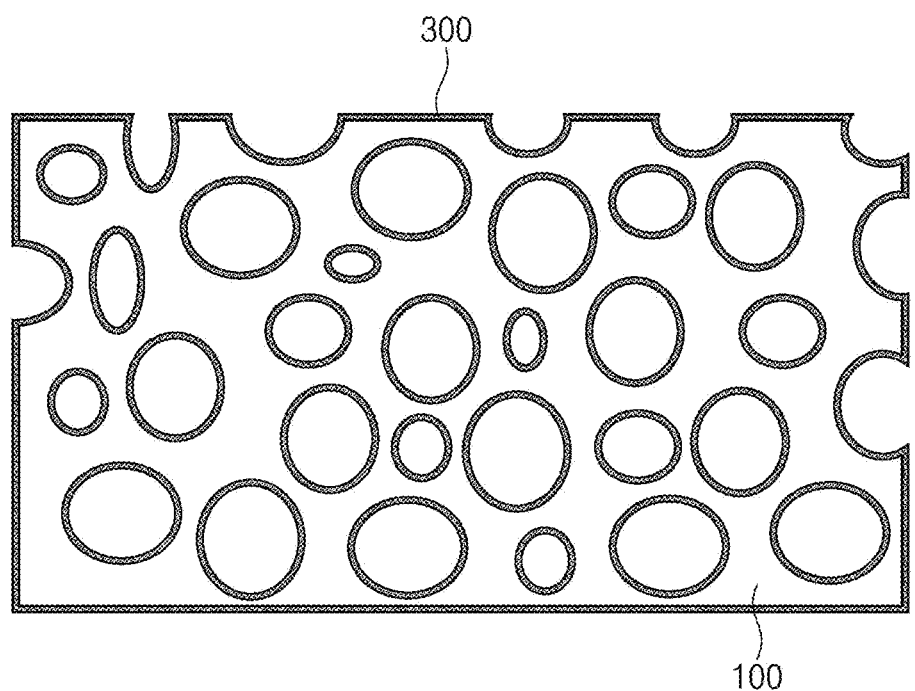
FIG. 6 is a view showing a crystalline seed layer covering the base substrate.
Figure 7:
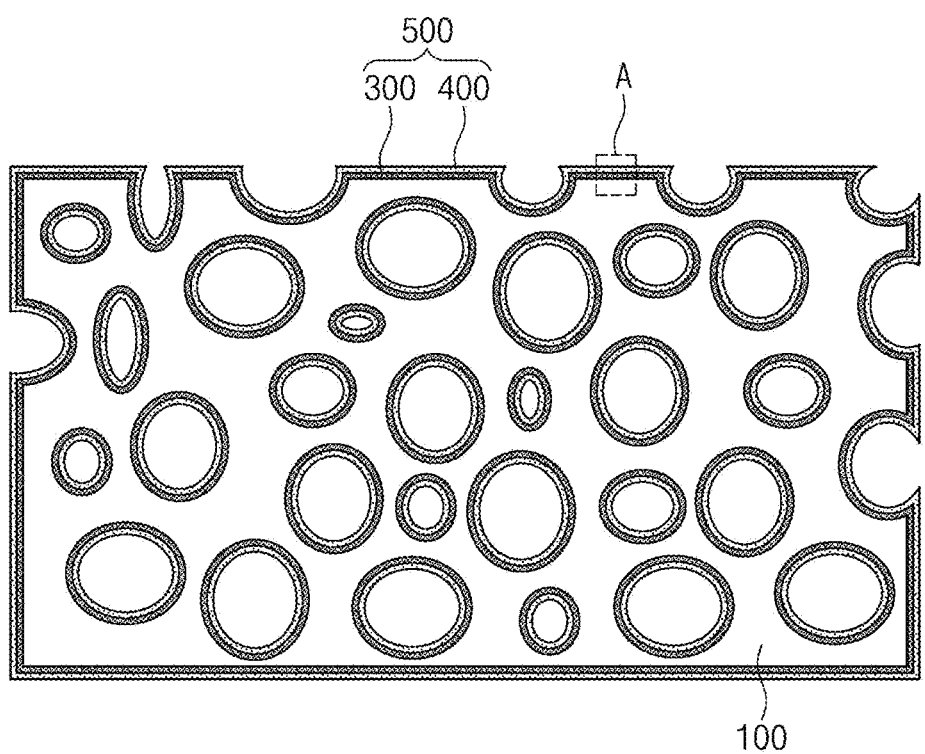
FIG. 7 is a view showing a functional film covering the seed layer.
Figure 8:
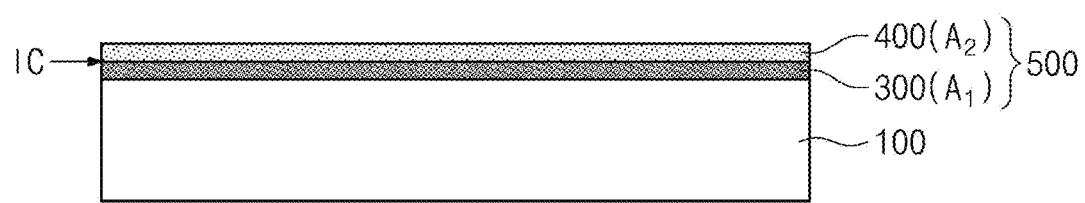
FIG. 8 is an enlarged view of A of FIG. 7.

FIG. 1 is a flowchart for describing a method of manufacturing an electrode structure according to an embodiment of the present invention, FIG. 2 is a view for describing a step of preparing a base substrate in the method of manufacturing the electrode structure according to the embodiment of the present invention, FIG. 3 is a view showing a base substrate used in the method of manufacturing the electrode structure according to the embodiment of the present invention, FIG. 4 is a view showing an amorphous seed layer covering the base substrate, FIG. 5 is a view specifically showing a process of manufacturing the seed layer, FIG. 6 is a view showing a crystalline seed layer covering the base substrate, FIG. 7 is a view showing a functional film covering the seed layer, and FIG. 8 is an enlarged view of A of FIG. 7.

Referring to FIGS. 1 to 3, a base substrate 100 may be prepared (S100). According to one embodiment, the preparing of the base substrate 100 may include: preparing a substrate 10; arranging the substrate 10 on a cooling device CD inside a chamber; and vaporizing a metal source MS to deposit a vaporized metal on the substrate 10 cooled by the cooling device CD. For example, the substrate 10 may be an aluminium foil. For example, the metal source MS may be an aluminium source. In other words, vaporized aluminium (Al) atoms may be deposited on a cooled aluminium foil. Accordingly, as shown in FIG. 3, the base substrate 100 may have a porous structure including the metal. In detail, the base substrate 100 may include: a bulky substrate 10 having a relatively high density; and a porous structure region disposed on the substrate 10 and having a relatively low density.

In addition, in the preparing of the base substrate 100, a process pressure of an inert gas (e.g., an argon gas) provided inside the chamber may be adjusted to adjust a mean free path of the vaporized metal. Accordingly, a density of the porous structure formed on the substrate 10 may be controlled.

A reducing metal precursor may be provided on the base substrate 100. The reducing metal precursor may remove a native oxide film NOL formed on the base substrate 100. For example, the reducing metal precursor may be trimethylaluminium (TMA).

In more detail, when the base substrate 100 is exposed to air, the native oxide film NOL may be formed on the base substrate 100. When a seed layer 200 that will be described below is formed in a state where the native oxide film NOL is formed, a resistance of an interface between the base substrate 100 and the seed layer 200 that will be described below may be increased, so that performance of an electrode structure that will be described below may be reduced. However, as described above, when the reducing metal precursor is provided on the base substrate 100, due to a reducing metal included in the reducing metal precursor, the native oxide film NOL may be reduced and removed. Accordingly, the resistance of the interface between the base substrate 100 and the seed layer 200 that will be described below may be reduced, so that the performance of the electrode structure that will be described below may be prevented from being reduced.

According to one embodiment, when the native oxide film NOL formed on the base substrate 100 is removed by the reducing metal precursor, the reducing metal (e.g., aluminium) may remain on a surface of the base substrate 100 from which the native oxide film NOL is removed.

According to one embodiment, the reducing metal precursor may be provided on the base substrate 100 in a state where the base substrate 100 is disposed inside the chamber for forming the seed layer 200 that will be described below. Accordingly, a process cost and a process time for removing the native oxide film NOL may be minimized.

Referring to FIGS. 1, 4, and 5, an amorphous seed layer 200 covering the base substrate 100 may be formed (S200). The amorphous seed layer 200 may be formed through atomic layer deposition (ALD). Accordingly, the amorphous seed layer 200 may conformally cover inner surfaces of pores of the base substrate 100.

In detail, as shown in FIG. 5, the forming of the amorphous seed layer 200 may include: providing a first precursor on the base substrate 100; performing purging; providing a first reaction source on the base substrate 100 on which the first precursor is provided; performing purging; providing a second precursor on the base substrate 100; performing purging; providing a second reaction source on the base substrate 100 on which the second precursor is provided; and performing purging.

According to one embodiment, the first precursor may include a first metal. Meanwhile, the second precursor may include a second metal. For example, when the seed layer 200 is for forming a positive electrode film, each of the first metal and the second metal may include one of lithium (Li), cobalt (Co), or titanium (Ti). For example, each of the first precursor and the second precursor may include one of lithium bis(trimethylsilyl)amide (LiHMDS), cyclopentadienylcobalt dicarbonyl (CpCo $(CO)_2$), or titanium tetraisopropoxide (TTIP).

According to one embodiment, each of the first reaction source and the second reaction source may include oxygen (O). For example, each of the first reaction source and the second reaction source may include one of water ($H_2O$) or ozone ($O_3$).

In more detail, the amorphous seed layer 200 may be formed by using a LiHMDS precursor and a CpCo $(CO)_2$ precursor. In this case, the forming of the amorphous seed layer 200 may include: providing LiHMDS on the base substrate 100 to adsorb the LiHMDS onto the base substrate; forming a lithium compound film (e.g., LiOH) on the base substrate 100 by providing $H_2O$; providing CpCo $(CO)_2$ on the lithium compound film to adsorb the CpCo $(CO)_2$ onto the lithium compound film; and forming a cobalt oxide film (e.g., $Co_3O_4$) on the lithium compound film by providing $H_2O$. The above-described process of forming the amorphous seed layer 200 may be repeatedly performed a plurality of times, and the forming of the lithium compound film and the forming of the cobalt oxide film may be repeatedly performed at different ratios. Further, in this case, the amorphous seed layer 200 may include $LiCoO_2$ and $Co_2O_3$, which are obtained by allowing the lithium compound film and the cobalt oxide film to react with each other.

Alternatively, when the amorphous seed layer 200 is formed through the atomic layer deposition by using LiHMDS and TTIP, the amorphous seed layer 200 may include LiOH, $TiO_2$, and the like.

First precursor provision step—purge step—first reaction source provision step—purge step described above may be defined as a first unit process. Meanwhile, second precursor provision step—purge step—second reaction source provision step—purge step described above may be defined as a second unit process. In addition, when the first unit process and the second unit process are sequentially performed, the first unit process and the second unit process may be defined as a group process.

According to one embodiment, when the first unit process is performed, a first seed layer may be formed. In other words, the first precursor and the first reaction source may react with each other to form the first seed layer. Meanwhile, when the second unit process is performed, a second seed layer may be formed. In other words, the second precursor and the second reaction source may react with each other to form the second seed layer.

According to one embodiment, the group process may be repeatedly performed. Accordingly, the first seed layer and the second seed layer may be alternately and repeatedly formed on the base substrate 100. In this case, a plurality of first seed layers and a plurality of second seed layers may be defined as the amorphous seed layer.

In addition, each of the first unit process and the second unit process may be repeatedly performed a plurality of times. When the first unit process and the second unit process are repeatedly performed a plurality of times, each of thicknesses of the first seed layer and the second seed layer may be controlled. For example, when a number of repetitions of the first unit process is increased, the thickness of the first seed layer may be increased. In addition, when a number of repetitions of the second unit process is increased, the thickness of the second seed layer may be increased. Accordingly, the first seed layer and the second seed layer having the controlled thicknesses may be disposed on the base substrate 100. In this case, the first seed layer and the second seed layer having the controlled thicknesses may be defined as the amorphous seed layer 200.

According to one embodiment, the amorphous seed layer 200 may not be divided into the first seed layer and the second seed layer. In more detail, when each of the first seed layer and the second seed layer does not have a predetermined thickness, the first seed layer and the second seed layer may not be distinguished from each other within the amorphous seed layer 200.

According to another embodiment, the amorphous seed layer 200 may be divided into the first seed layer and the second seed layer. In more detail, when each of the first seed layer and the second seed layer has the predetermined thickness or more, the first seed layer and the second seed layer may be distinguished from each other within the amorphous seed layer 200.

Unlike the description above, the amorphous seed layer 200 may be formed through a first unit process defined as first precursor provision step—purge step—first reaction source provision step—purge step, a second unit process defined as second precursor provision step—purge step—second reaction source provision step—purge step, and a third unit process defined as third precursor provision step—purge step—third reaction source provision step—purge step.

The first to third precursors may include first to third metals, respectively. For example, each of the first to third metals may include one of lithium (Li), zirconium (Zr), or lanthanum (La). For example, each of the first to third precursors may include one of lithium bis(trimethylsilyl)amide (LiHMDS), tetrakis(ethylmethylamino) zirconium (TEMAZr), and tris(N,N'-diisopropylformamidinato)lanthanum (LaFAMD). According to one embodiment, each of the first to third reaction sources may include water ($H_2O$).

In more detail, the amorphous seed layer 200 may be formed by using a LiHMDS precursor, a TEMAZr precursor, and LaFAMD. In this case, the amorphous seed layer 200 may include $Li_2CO_3$, $Li_2ZrO_3$, $La_2Zr_2O_7$, $ZrO_2$, and the like.

According to one embodiment, when the first unit process is performed, a first seed layer may be formed. Meanwhile, when the second unit process is performed, a second seed layer may be formed. Meanwhile, when the third unit process is performed, a third seed layer may be formed. The first to third seed layers may also be distinguished from each other when each of the first to third seed layers has a predetermined thickness, whereas the first to third seed layers may not be distinguished from each other when each of the first to third seed layers does not have the predetermined thickness. The first to third seed layers may be defined as the amorphous seed layer 200.

Referring to FIGS. 1 and 6, the amorphous seed layer 200 may be annealed. Accordingly, the amorphous seed layer 200 may be converted into a crystalline seed layer 300 (S300). In other words, when the seed layer is annealed, an amorphous structure may be converted into a crystalline structure.

According to one embodiment, the amorphous seed layer 200 may be annealed at a temperature of 600° C. or higher. Meanwhile, when the amorphous seed layer 200 is annealed at a temperature of less than 600° C., the amorphous seed layer 200 may not be converted into a crystalline form.

According to one embodiment, the forming of the amorphous seed layer 200 and the annealing of the amorphous seed layer 200 may be performed in mutually different devices. For example, the forming of the amorphous seed layer 200 may be performed in a chamber. Meanwhile, the annealing of the amorphous seed layer 200 may be performed in a furnace. Accordingly, the amorphous seed layer 200 may be transferred from the chamber to the furnace so as to be annealed. In a process of transferring the amorphous seed layer 200, a native by-product layer NPB may be formed on the amorphous seed layer 200.

In more detail, when the amorphous seed layer 200 is transferred, the amorphous seed layer 200 may be exposed to air. In this case, the amorphous seed layer 200 may react with water ($H_2O$) and oxygen in the air to form the native by-product layer NPB. For example, when the amorphous seed layer 200 is formed by using the LiHMDS precursor and the CpCo $(CO)_2$ precursor, the amorphous seed layer 200 may react with the water in the air to form $Li_2CO_3$. When a thin film is formed on the amorphous seed layer 200 in a state where the native by-product layer NPB is formed, a resistance of an interface between the amorphous seed layer 200 and the thin film may be increased.

However, as described above, when the amorphous seed layer 200 is annealed, the native by-product layer NPB may be removed. Accordingly, when the thin film is formed on the crystalline seed layer 300, a resistance of an interface between the crystalline seed layer 300 and the thin film may be reduced, so that performance and reliability of a structure including the crystalline seed layer 300 may be improved.

According to one embodiment, the annealing of the amorphous seed layer 200 may include: covering the amorphous seed layer 200 with a barrier sheet BS; and annealing the amorphous seed layer 200 covered with the barrier sheet BS.

The barrier sheet BS may include the first metal included in the amorphous seed layer 200. For example, when the amorphous seed layer 200 includes lithium (Li), the barrier sheet BS may also include lithium (Li). Alternatively, the barrier sheet BS may include substantially the same compound as the amorphous seed layer 200. In detail, when the amorphous seed layer 200 includes $LiCoO_2$, the barrier sheet BS may be a green sheet prepared by coating a film with $LiCoO_2$ particles.

Accordingly, the barrier sheet BS may reduce a leakage of the first metal inside the amorphous seed layer 200 to an outside of the amorphous seed layer 200 while performing the annealing on the amorphous seed layer 200.

Meanwhile, when the amorphous seed layer 200 is annealed without the barrier sheet BS, the first metal (e.g., lithium) inside the amorphous seed layer 200 may leak out of the amorphous seed layer 200. Accordingly, a content of the first metal (e.g., lithium) inside the crystalline seed layer 300 may be less than a content of the first metal (e.g., lithium) inside the amorphous seed layer 200.

When a battery such as a secondary battery is manufactured through the crystalline seed layer 300, the content of the first metal (e.g., lithium) inside the crystalline seed layer 300 may be directly linked to a capacity and performance of the battery. Accordingly, when the first metal (e.g., lithium) leaks out of the amorphous seed layer 200, the capacity and the performance of the battery manufactured through the crystalline seed layer 300 may be reduced.

In addition, when the amorphous seed layer 200 is annealed without the barrier sheet BS, the amorphous seed layer 200 may be peeled off from the base substrate 100.

However, as described above, when the amorphous seed layer 200 is annealed after being covered with the barrier sheet BS including the first metal, the leakage of the first metal (e.g., lithium) may be reduced by the barrier sheet BS, so that the reduction in the capacity and the performance of the battery manufactured through the crystalline seed layer 300 may be resolved. In addition, the peeling-off of the amorphous seed layer 200 from the base substrate 100 may be resolved.

The reducing metal precursor may be provided on the crystalline seed layer 300. The reducing metal precursor may remove the native oxide film NOL formed on the crystalline seed layer 300. According to one embodiment, the reducing metal may have a higher oxygen affinity than each of the first to third metals included in the amorphous seed layer 200. For example, the reducing metal may be aluminium (Al). In addition, the reducing metal precursor may be trimethylaluminium (TMA).

In more detail, after the annealing is completed in the furnace, in a process of moving into an atomic layer deposition chamber to deposit a functional film (a positive electrode layer, a negative electrode layer, or a solid electrolyte layer) for a secondary battery that will be described below on the crystalline seed layer 300, when the crystalline seed layer 300 is exposed to air, the native oxide film NOL may be formed on the crystalline seed layer 300. When a functional film 400 that will be described below is formed in a state where the native oxide film NOL is formed, a resistance of an interface between the crystalline seed layer 300 and the functional film 400 that will be described below may be increased, so that the performance of the electrode structure that will be described below may be reduced. However, as described above, when the reducing metal precursor is provided on the crystalline seed layer 300, due to the reducing metal, the native oxide film NOL may be reduced and removed. Accordingly, the resistance of the interface between the crystalline seed layer 300 and the functional film 400 that will be described below may be reduced, so that the performance of the electrode structure that will be described below may be prevented from being reduced.

According to one embodiment, when the native oxide film NOL formed on the crystalline seed layer 300 is removed by the reducing metal precursor, the reducing metal (e.g., aluminium) may remain on the crystalline seed layer 300 from which the native oxide film NOL is removed.

In addition, according to one embodiment, the reducing metal precursor may be provided on the base substrate 100 in a state where the base substrate 100 is disposed inside the chamber for forming the functional film 400 that will be described below. Accordingly, the process cost and the process time for removing the native oxide film NOL may be minimized.

Referring to FIGS. 1, 7, and 8, a functional film 400 covering the crystalline seed layer 300 may be formed (S400). Accordingly, an electrode structure including the base substrate 100, the crystalline seed layer 300 covering the base substrate 100, and the functional film 400 covering the crystalline seed layer 300 may be provided. As shown in FIG. 7, the seed layer 300 and the functional film 400 may conformally cover the inner surfaces of the pores of the base substrate 100.

The functional film 400 may be formed from the crystalline seed layer 300. In other words, the functional film 400 may be epitaxially grown along a lattice of the crystalline seed layer 300. Accordingly, the functional film 400 may inherently have a crystalline structure. In other words, the functional film 400 may inherently have a crystalline structure while being deposited due to the crystalline seed layer 300 without having a crystalline structure acquired by a post-treatment process after being deposited.

According to one embodiment, the functional film 400 may include the same material as the crystalline seed layer 300. In other words, the functional film 400 may be grown by using the same material as the crystalline seed layer 300. Alternatively, according to another embodiment, the functional film 400 may include a material that is different from a material of the crystalline seed layer 300. However, the material included in the functional film 400 may have a lattice constant that is substantially identical or similar to a lattice constant of the material included in the crystalline seed layer 300. Accordingly, the functional film 400 may be easily deposited along the crystalline seed layer 300 to inherently have a crystallized structure.

In addition, the functional film 400 may be formed by using the same atomic layer deposition process as the crystalline seed layer 300. As described above, when the functional film 400 and the crystalline seed layer 300 are formed of the same material, the functional film 400 may be deposited by using a precursor that is identical to the precursor used for depositing the crystalline seed layer 300.

Further, the functional film 400 may have a thicker thickness than the crystalline seed layer 300. Accordingly, as described above, when the functional film 400 and the crystalline seed layer 300 are formed by using the atomic layer deposition process, a number of processes for depositing the functional film 400 may be greater than a number of processes for depositing the crystalline seed layer 300.

Unlike the embodiment of the present invention described above, the crystalline seed layer 300 may not be prepared, and after the functional film 400 in an amorphous state is deposited, the functional film 400 may be annealed through a subsequent annealing process. In this case, a surface of the functional film 400 may deteriorate during the annealing process, so that it is not easy to prepare the functional film 400 having a crystalline structure.

However, according to the embodiment of the present invention, after the amorphous seed layer 200 having a thin thickness is deposited, the amorphous seed layer 200 having the thin thickness is annealed so as to be crystallized, and the functional film 400 inherently having a crystalline structure may be formed by using the crystalline seed layer 300. In other words, an annealing process for crystallization may be performed on the amorphous seed layer 200 having the thin thickness to prepare the crystalline seed layer 300 while minimizing surface deterioration of the amorphous seed layer 200, and the functional film 400 inherently having the crystalline structure may be easily formed without the subsequent annealing process.

In addition, according to one embodiment, a degree of crystallinity of the functional film 400 may be less than a degree of crystallinity of the crystalline seed layer 300. In other words, the crystalline seed layer 300 prepared by annealing the amorphous seed layer 200 at a high temperature may have higher crystallinity than the functional film 400.

According to one embodiment, the crystalline seed layer 300 and the functional film 400 may be distinguished from each other. In this case, an interface IC may be provided between the crystalline seed layer 300 and the functional film 400, and the interface IC may be observed through a scanning electron microscopy (SEM) or transmission electron microscopy (TEM) image. In this case, the reducing metal may be observed in a region adjacent to the interface.

Alternatively, according to another embodiment, the crystalline seed layer 300 and the functional film 400 may constitute a material film 500 configured as one body. In other words, the crystalline seed layer 300 and the functional film 400 may not be substantially distinguished from each other through the SEM or TEM image.

When the crystalline seed layer 300 and the functional film 400 constitute one material film 500, the material film 500 may be divided into a first region A1 and a second region A2, which have mutually different degrees of crystallinity. According to one embodiment, the first region A1 may be disposed between the second region A2 and the base substrate 100, and the degree of crystallinity of the first region A1 may be higher than the degree of crystallinity of the second region A2. In this case, the first region A1 may correspond to the crystalline seed layer 300, and the second region A2 may correspond to the functional film 400. In addition, when the crystalline seed layer 300 and the functional film 400 constitute one material film 500, the reducing metal may be included between the surface of the base substrate 100 and the material film 500 or included within the material film 500.

The functional film 400 may constitute one of a positive electrode, a negative electrode, or a solid electrolyte for a secondary battery. In other words, the functional film 400 may be used as one of the positive electrode, the negative electrode, or the solid electrolyte for the secondary battery. In this case, as described above, since the functional film 400 inherently has a crystalline structure, a lifespan and a capacity of a secondary battery including the functional film 400 may be improved.

In more detail, in a case of a positive electrode, a negative electrode, or a solid electrolyte for a secondary battery according to the related art, after the positive electrode, the negative electrode, or the solid electrolyte is formed, an additional annealing process for crystallizing the positive electrode, the negative electrode, or the solid electrolyte is performed. However, as a surface deteriorates during the additional annealing process, roughness of the surface is increased, and a thin film is peeled off, so that an interface resistance is increased. As a result, due to the problems described above, a lifespan and a capacity of a secondary battery are reduced.

On the contrary, since the functional film 400 inherently has a crystalline structure, unlike the positive electrode, the negative electrode, or the solid electrolyte for the secondary battery according to the related art, the additional annealing process may not be performed. Accordingly, the surface deterioration may be prevented, so that the interface resistance may be reduced, and thus the lifespan and the capacity of the secondary battery may be improved.

Accordingly, an electrode structure and a manufacturing method thereof according to the embodiment of the present invention have been described. Hereinafter, a specific experimental example and a characteristic evaluation result of the electrode structure and the manufacturing method thereof according to the embodiment of the present invention will be described.

Preparation of Electrode Structure According to Experimental Example

A base substrate in which an aluminium foam is formed on an aluminium foil is prepared. A $Co_3O_4$ layer was deposited on the aluminium foam by performing CpCo $(CO)_2$ provision step—purge step—$O_3$ provision step—purge step. As a more specific condition for depositing the $CO_3O_4$ layer, the purge step was performed in an argon (Ar) 200 sccm atmosphere, and a deposition temperature was 150° C.

Figure 9:
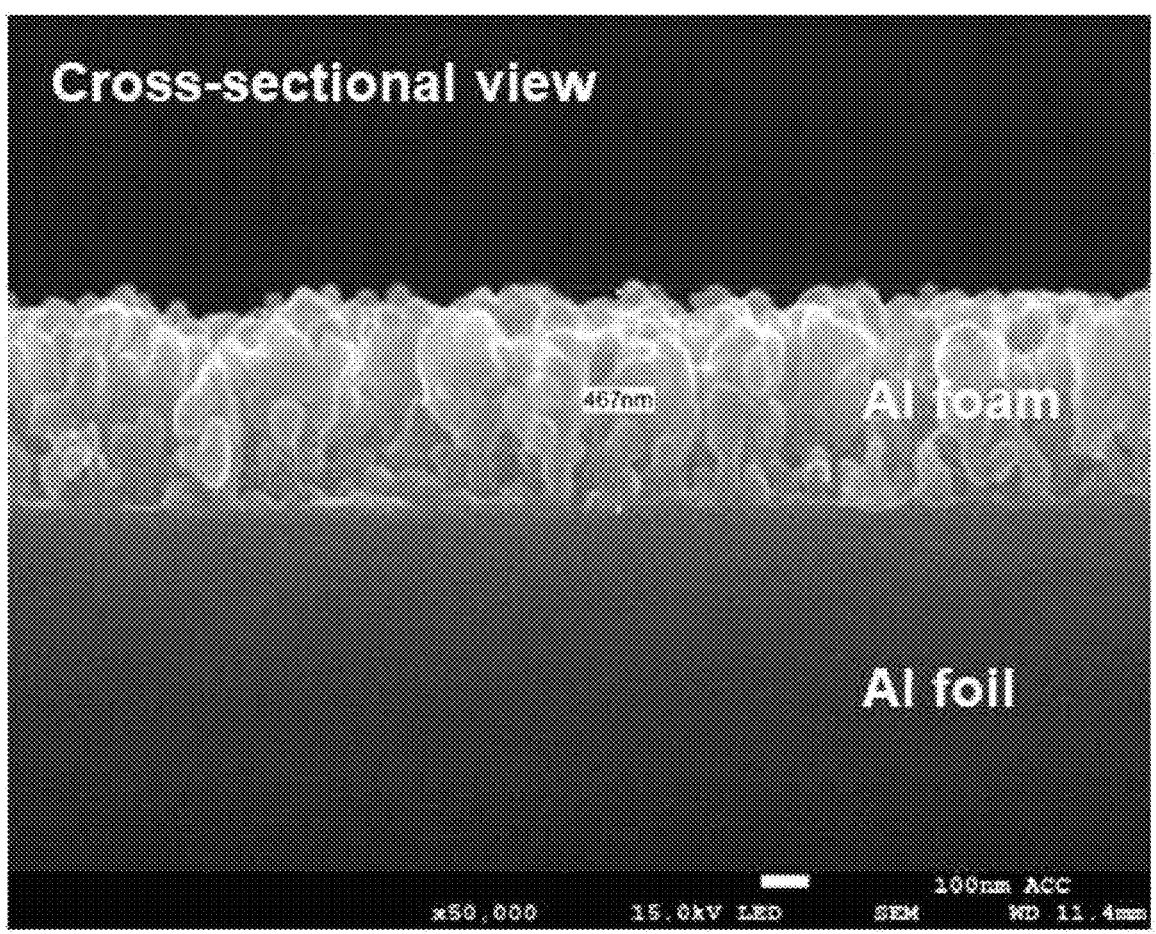
FIG. 9 is a photograph corresponding to a cross-sectional view of a base substrate used in a process of manufacturing an electrode structure according to Experimental Example of the present invention.
Figure 10:
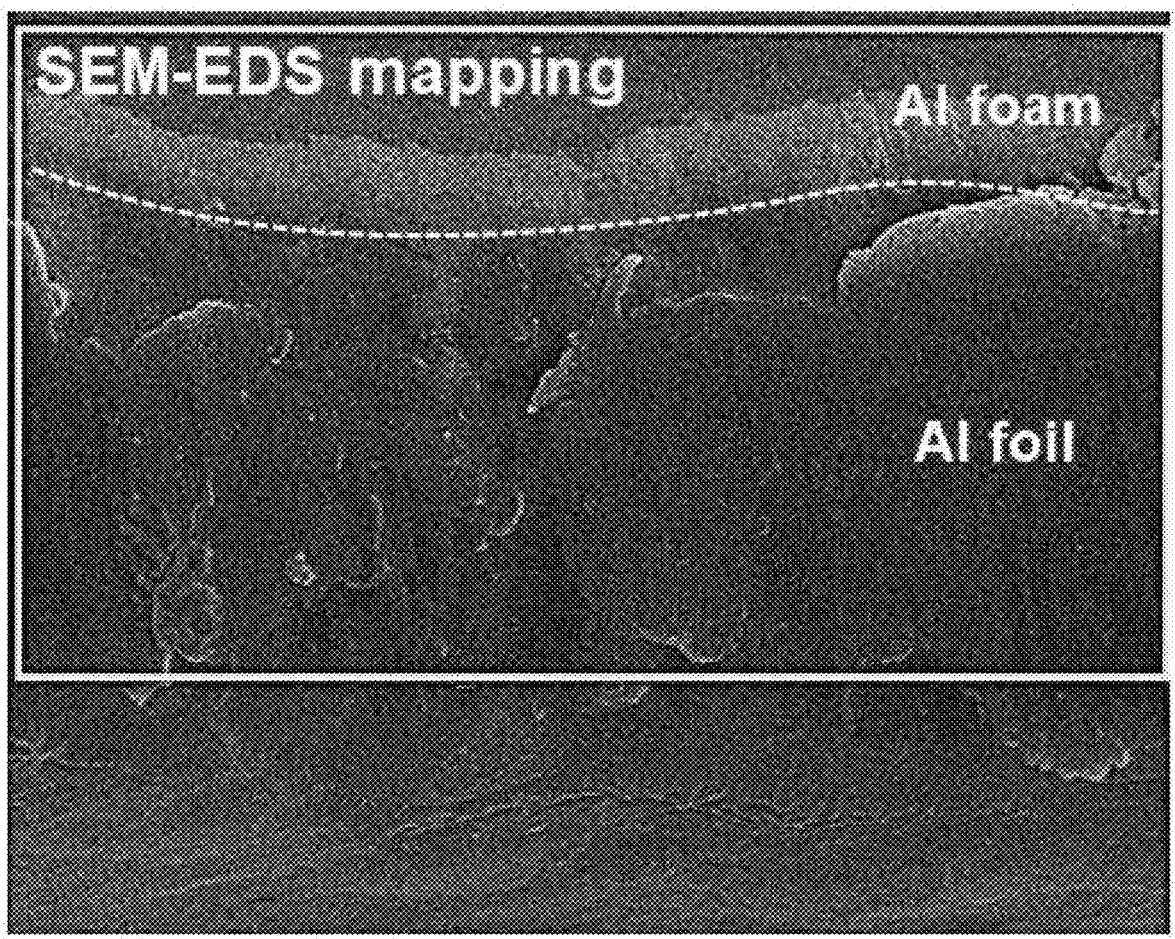
FIGS. 10 and 11 are scanning electron microscopy (SEM)-energy dispersive X-ray spectroscopy (EDS) mapping photographs corresponding to cross-sectional views of the electrode structure according to Experimental Example of the present invention.
Figure 11:
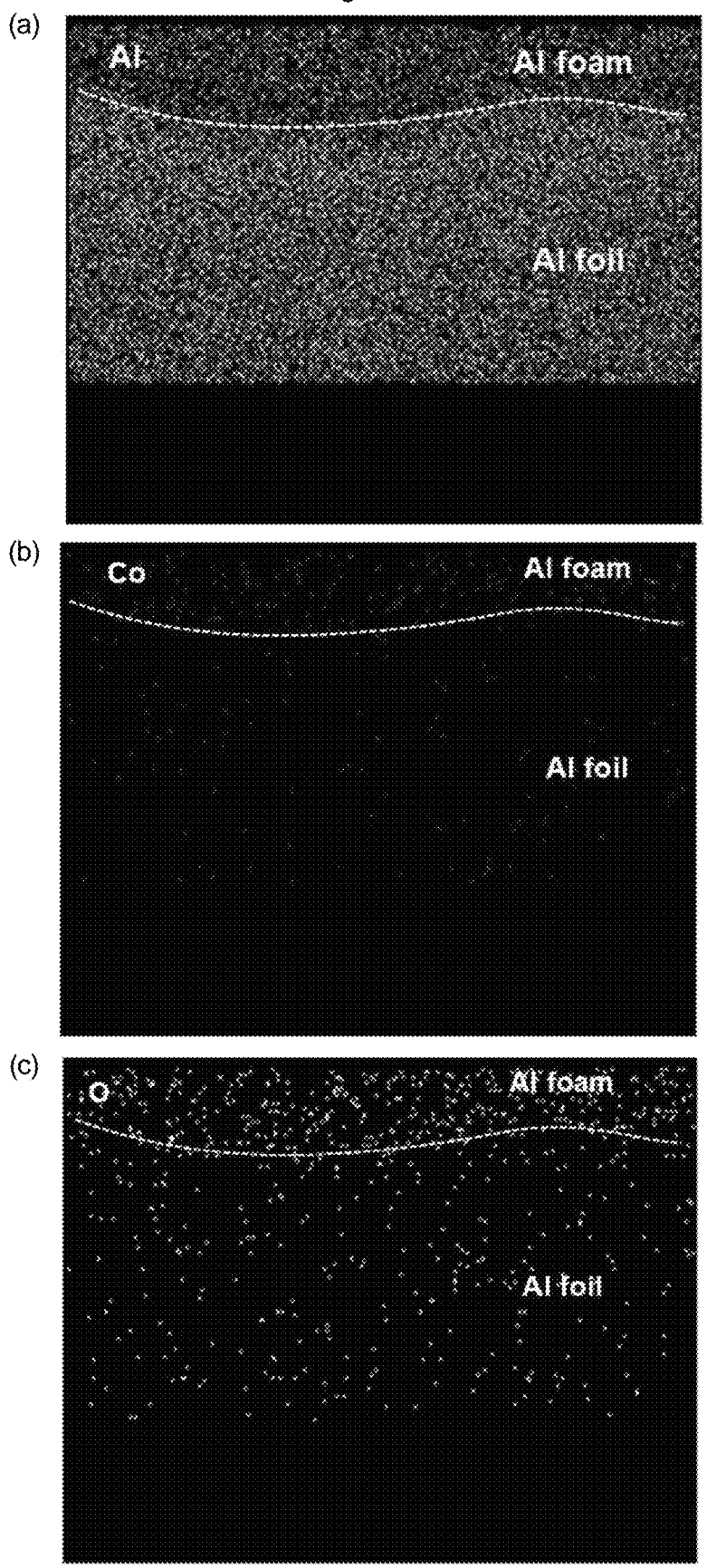

FIG. 9 is a photograph corresponding to a cross-sectional view of a base substrate used in a process of manufacturing an electrode structure according to Experimental Example of the present invention, and FIGS. 10 and 11 are scanning electron microscopy (SEM)-energy dispersive X-ray spectroscopy (EDS) mapping photographs corresponding to cross-sectional views of the electrode structure according to Experimental Example of the present invention.

Referring to FIG. 9, a cross-sectional view of a base substrate used in a process of manufacturing an electrode structure according to Experimental Example of the present invention was obtained and shown through scanning electron microscopy (SEM). As shown in FIG. 9, it was found that the base substrate includes an aluminium foil and an aluminium foam, and the aluminium foam has a porous structure.

Referring to FIG. 10, a cross-sectional view of the base substrate was shown through scanning electron microscopy (SEM)-energy dispersive X-ray spectroscopy (EDS) mapping. Referring to FIG. 11(a), a cross-sectional view of the electrode structure was shown through the SEM-EDS mapping to show distribution of aluminium (Al). Referring to FIG. 11(b), the cross-sectional view of the electrode structure was shown through the SEM-EDS mapping to show distribution of cobalt (Co). Referring to FIG. 11(c), the cross-sectional view of the electrode structure was shown through the SEM-EDS mapping to show distribution of oxygen (O).

As shown in FIGS. 10 and 11, it was found that cobalt (Co) is uniformly distributed inside the aluminium foam having a porous structure. Accordingly, it may be understood that a thin film is uniformly grown on a nanostructure having a three-dimensional structure.

Figure 12:
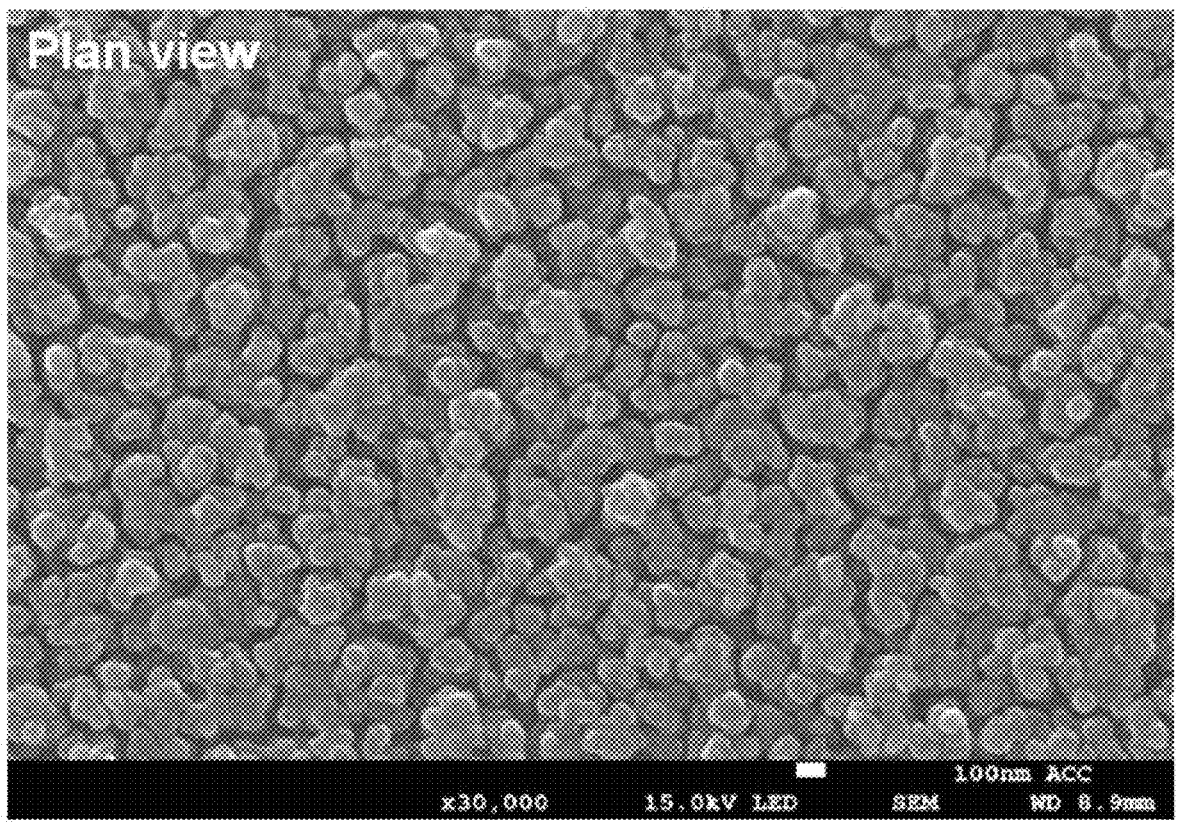
FIG. 12 is a photograph corresponding to a plan view of the base substrate used in the process of manufacturing the electrode structure according to Experimental Example of the present invention.
Figure 13:
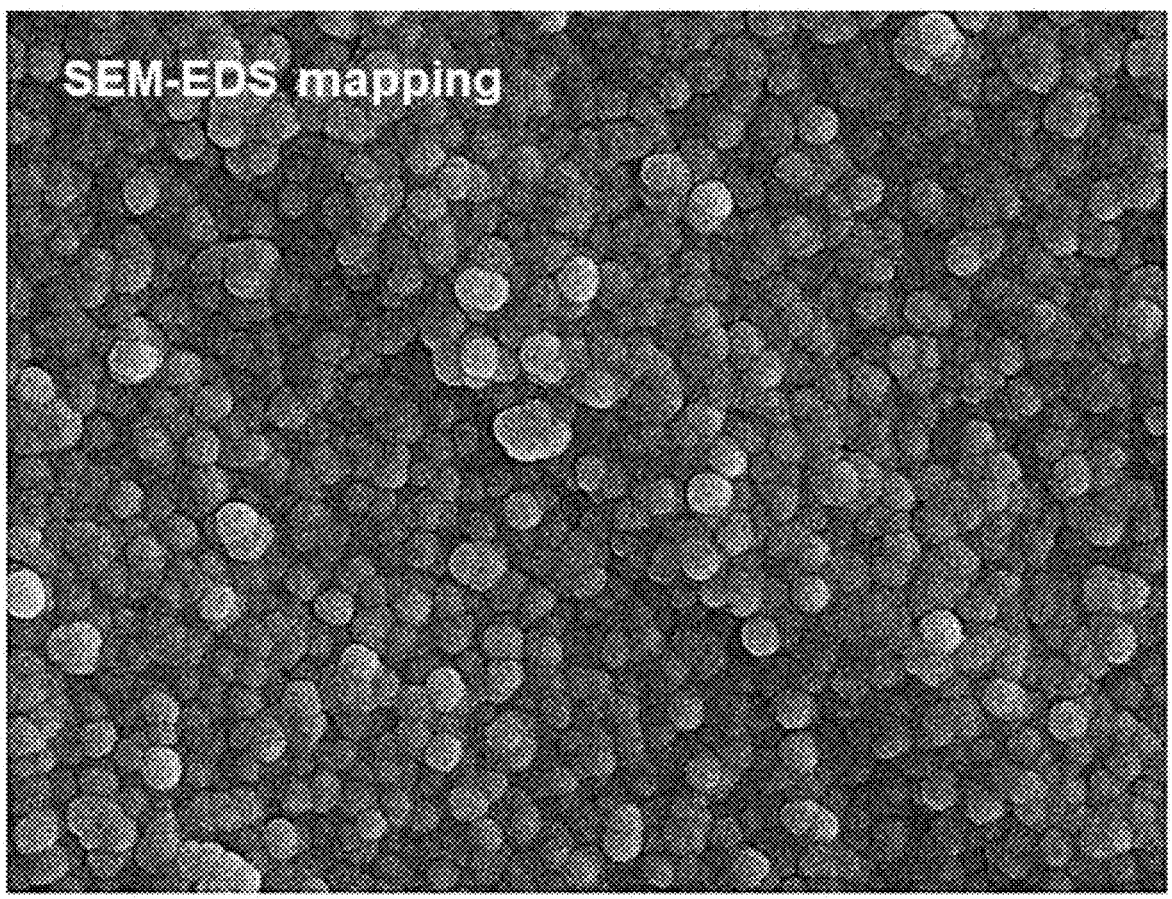

FIG. 12 is a photograph corresponding to a plan view of the base substrate used in the process of manufacturing the electrode structure according to Experimental Example of the present invention, and FIGS. 13 and 14 are SEM-EDS mapping photographs corresponding to plan views of the electrode structure according to Experimental Example of the present invention.

Referring to FIG. 12, a plan view of the base substrate used in the process of manufacturing the electrode structure according to Experimental Example of the present invention was obtained and shown through scanning electron microscopy (SEM). As shown in FIG. 12, it was found that the aluminium foam included in the base substrate has a porous structure.

Referring to FIG. 13, a plan view of the base substrate was shown through scanning electron microscopy (SEM)-energy dispersive X-ray spectroscopy (EDS) mapping. Referring to FIG. 14(a), a plan view of the electrode structure was shown through the SEM-EDS mapping to show the distribution of aluminium (Al). Referring to FIG. 14(b), the plan view of the electrode structure was shown through the SEM-EDS mapping to show the distribution of cobalt (Co). Referring to FIG. 14(c), the plan view of the electrode structure was shown through the SEM-EDS mapping to show the distribution of oxygen (O).

As shown in FIGS. 13 and 14, it was found that cobalt (Co) is uniformly distributed inside the aluminium foam having a porous structure. Accordingly, it may be understood that a thin film is uniformly grown on a nanostructure having a three-dimensional structure.

Preparation of Material Film According to Example 1

A material film was prepared by performing a first unit process including LiHMDS provision step—purge step—$H_2O$ provision step—purge step, and a second unit process including CpCo $(CO)_2$ provision step—purge step—$O_3$ provision step—purge step on a $SiO_2$ substrate. Thereafter, the material film was covered with a green sheet prepared by coating a film with a bulk positive electrode material (LiCoO$_2$), and the material film was annealed, so that a material film according to Example 1 was prepared.

Preparation of Material Film According to Example 1-1

A material film according to Example 1-1 was prepared by controlling a ratio of the first unit process and the second unit process to be 1:2 while preparing the material film according to Example 1.

Preparation of Material Film According to Example 1-2

A material film according to Example 1-2 was prepared by controlling the ratio of the first unit process and the second unit process to be 1:6 while preparing the material film according to Example 1-1.

Preparation of Material Film According to Comparative Example 1-1

A material film according to Comparative Example 1-1 was prepared by not performing the annealing while preparing the material film according to Example 1-1.

Preparation of Material Film According to Comparative Example 1-2

A material film according to Comparative Example 1-2 was prepared by not performing the annealing while preparing the material film according to Example 1-2.

Preparation of Material Film According to Comparative Example 1-3

A material film according to Comparative Example 1-3 was prepared by performing the annealing without the green sheet while preparing the material film according to Example 1-1.

The material films according to Example 1 and Comparative Examples 1-1 to 1-3 may be summarized in Table 1 below.

TABLE 1

| Classification | Precursor Metal | Process Ratio | Annealing | Use of Green Sheet |
|---|---|---|---|---|
| Example 1-1 | Li—Co | 1:2 | ○ | ○ |
| Example 1-2 | Li—Co | 1:6 | ○ | ○ |
| Comparative Example 1-1 | Li—Co | 1:2 | X | X |
| Comparative Example 1-2 | Li—Co | 1:6 | X | X |
| Comparative Example 1-3 | Li—Co | 1:2 | ○ | X |

Figure 15:
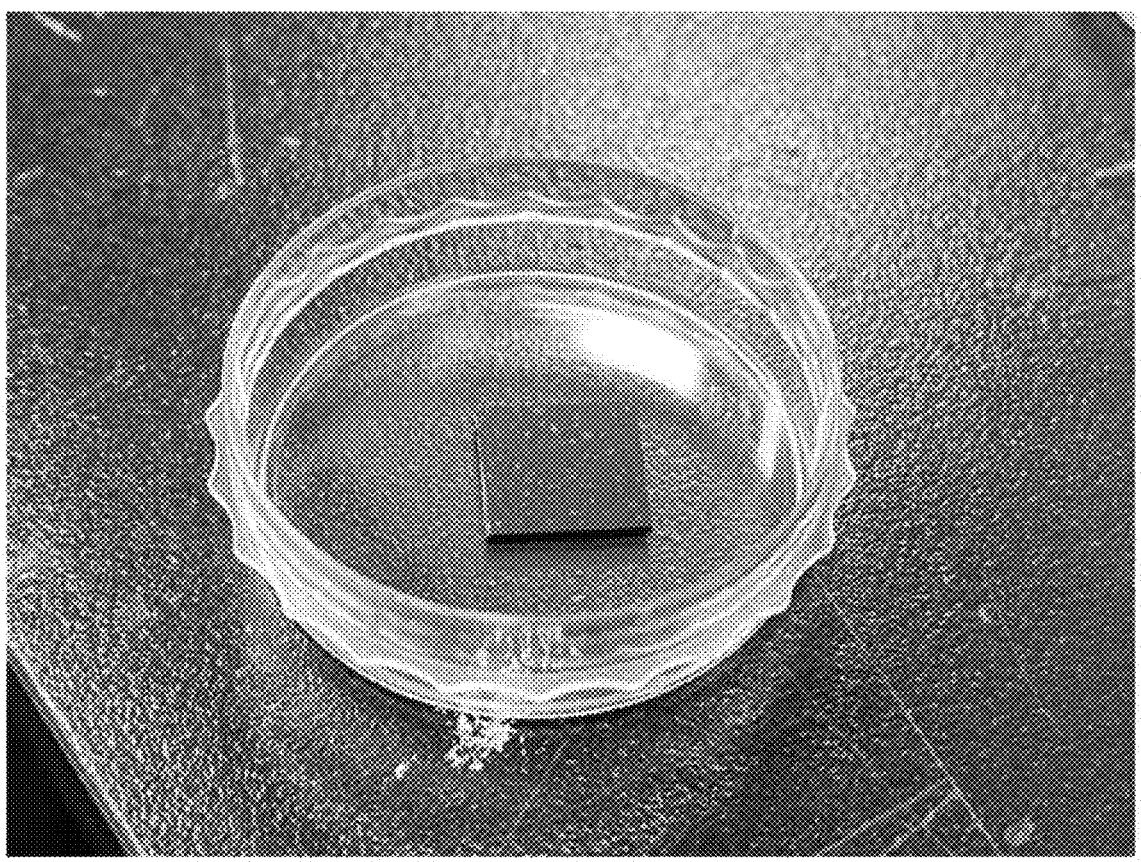
FIGS. 15 and 16 are photographs for comparing annealing effects through a green sheet.
Figure 16:
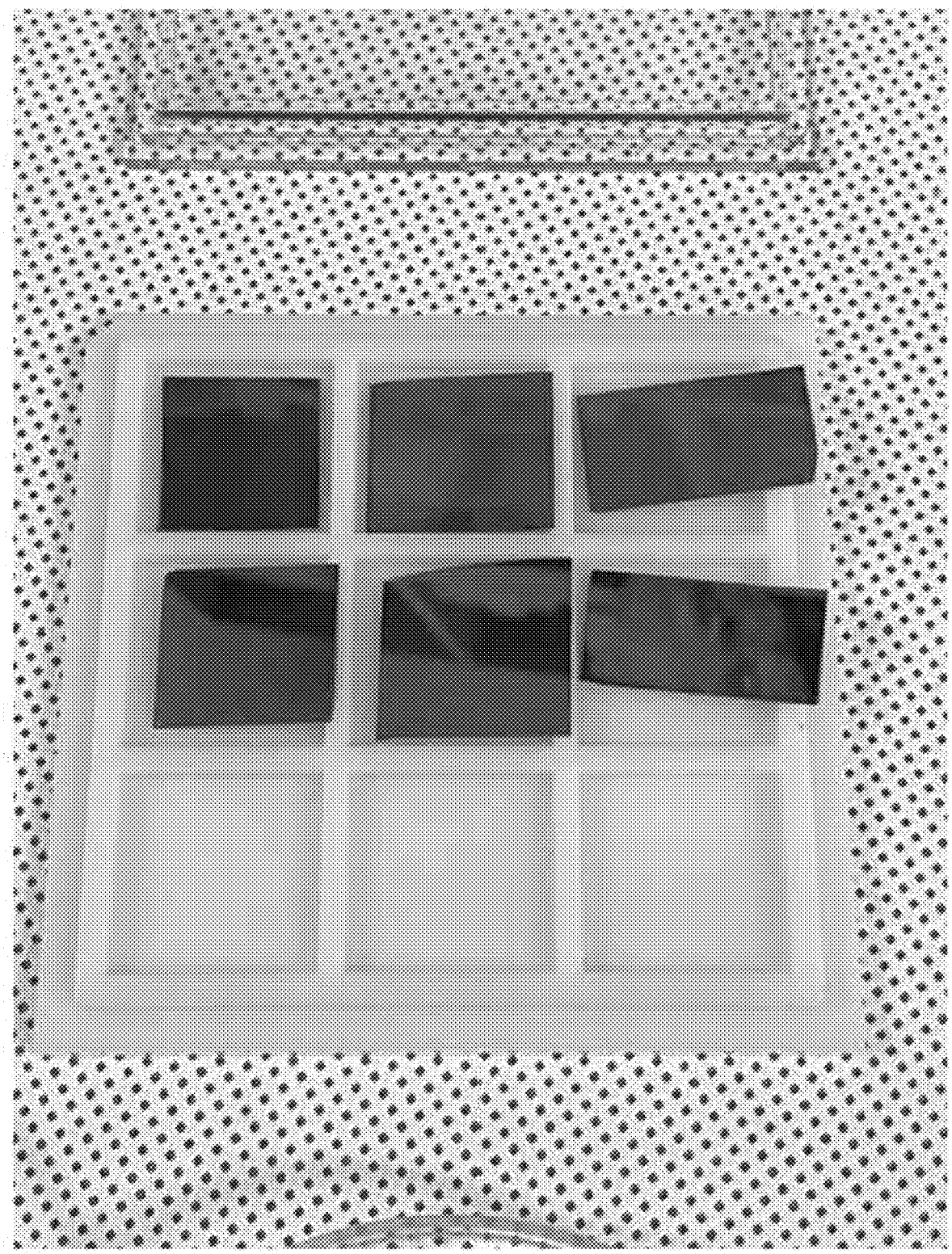

FIGS. 15 and 16 are photographs for comparing annealing effects through a green sheet.

Referring to 15, the material film according to Comparative Example 1-3 was prepared, and the prepared material film was photographed and shown. Referring to FIG. 16, the material film according to Example 1-1 was prepared, and the prepared material film was photographed and shown. An upper row of FIG. 16 is a photograph of the $SiO_2$ substrate, and a lower row of FIG. 16 is a photograph of the material film deposited on the $SiO_2$ substrate.

As shown in FIGS. 15 and 16, it was found that the material film according to Example 1-1 is easily deposited on the substrate, whereas a peeling-off phenomenon occurs in the material film of Comparative Example 1-3. In other words, it may be understood that the peeling-off phenomenon of the material film occurs when the annealing is performed without the green sheet.

Figure 17:
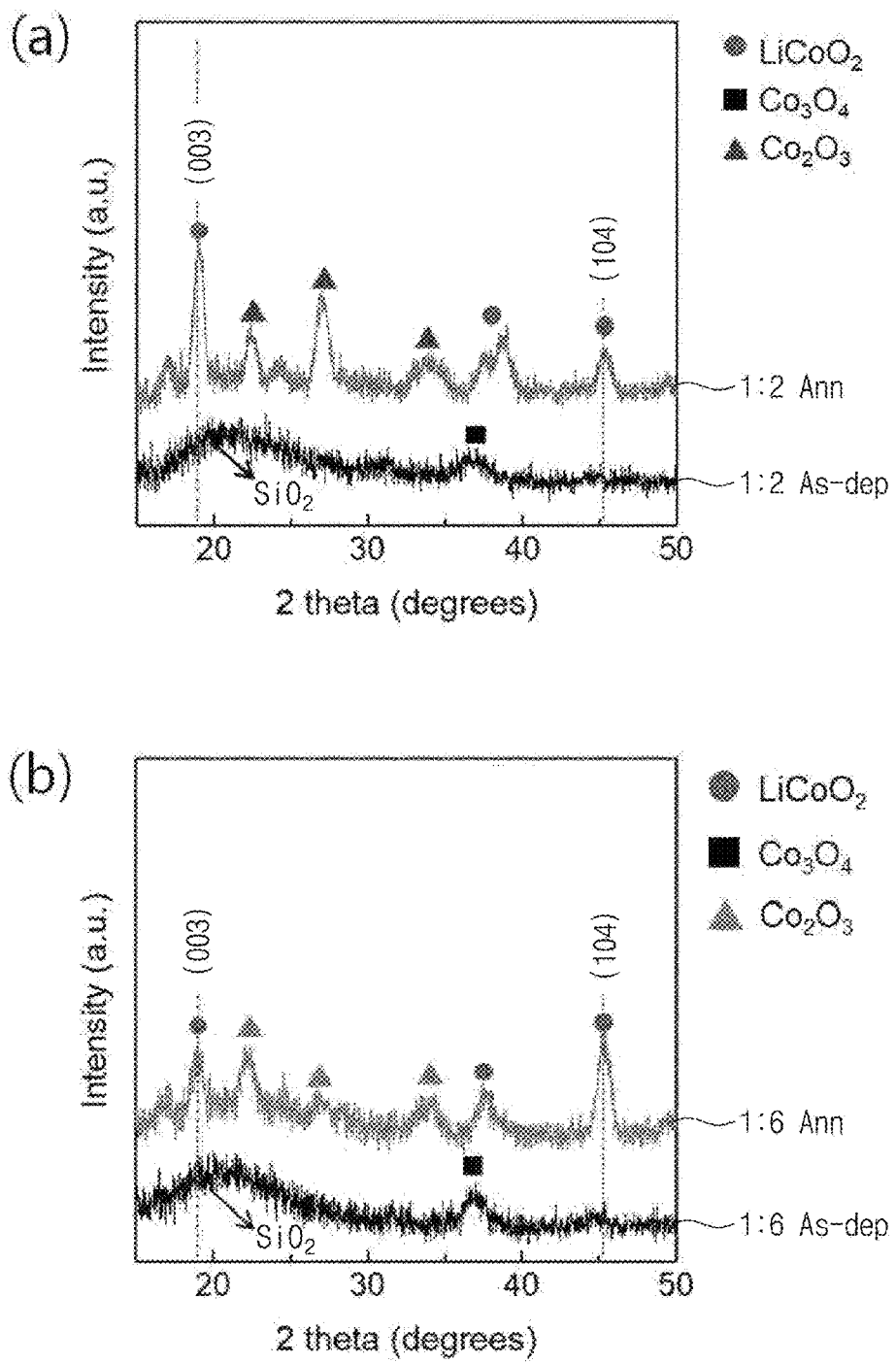
FIG. 17 is an X-ray diffraction (XRD) graph for comparing crystallinity of material films according to Example 1 and Comparative Example 1 of the present invention.

FIG. 17 is an X-ray diffraction (XRD) graph for comparing crystallinity of material films according to Example 1 and Comparative Example 1 of the present invention.

Referring to FIG. 17(a), X-ray diffraction (XRD) analysis was performed on the material films according to Example 1-1 and Comparative Example 1-1 and shown. Referring to FIG. 17(b), XRD analysis was performed on the material films according to Examples 1-2 and Comparative Examples 1-2 and shown.

As shown in FIG. 17, it was found that the material films according to Examples 1-1 and 1-2 exhibit a crystalline structure, whereas the material films according to Comparative Example 1-1 and Comparative Example 1-2 exhibit an amorphous structure. Accordingly, it may be understood that when the material film having an amorphous structure is annealed, the material film is converted into a crystalline structure.

FIGS. 18 to 21 are X-ray photoelectron spectroscopy (XPS) graphs for comparing compositions of the material films according to Example 1 and Comparative Example 1 of the present invention.

Referring to FIG. 18(a), in order to observe C is within the material film according to Example 1-1 (1:2 Ann) and the material film according to Comparative Example 1-1 (1:2 As-dep), X-ray photoelectron spectroscopy (XPS) analysis was performed and shown. Referring to FIG. 18(b), in order to observe C is within the material film according to Example 1-2 (1:6 Ann) and the material film according to Comparative Example 1-2 (1:6 As-dep), the XPS analysis was performed and shown.

Referring to FIG. 19(a), in order to observe O 1s within the material film according to Example 1-1 (1:2 Ann) and the material film according to Comparative Example 1-1 (1:2 As-dep), X-ray photoelectron spectroscopy (XPS) analysis was performed and shown. Referring to FIG. 19(b), in order to observe O 1s within the material film according to Example 1-2 (1:6 Ann) and the material film according to Comparative Example 1-2 (1:6 As-dep), the XPS analysis was performed and shown.

As shown in FIGS. 18 and 19, it was found that a $Li_2CO_3$ peak is observed in the material films according to Comparative Examples 1-1 and 1-2 that are not annealed, whereas a $Co_2O_3$ peak is observed without the $Li_2CO_3$ peak in the material films according to Examples 1-1 and 1-2 that are annealed.

Referring to FIG. 20(a), in order to observe Li 1s and Co 3p within the material film according to Example 1-1 (1:2 Ann) and the material film according to Comparative Example 1-1 (1:2 As-dep), X-ray photoelectron spectroscopy (XPS) analysis was performed and shown. Referring to FIG. 20(b), in order to observe Li 1s and Co 3p within the material film according to Example 1-2 (1:6 Ann) and the material film according to Comparative Example 1-2 (1:6 As-dep), the XPS analysis was performed and shown.

Referring to FIG. 21(a), in order to observe Co 2p within the material film according to Example 1-1 (1:2 Ann) and the material film according to Comparative Example 1-1 (1:2 As-dep), X-ray photoelectron spectroscopy (XPS) analysis was performed and shown. Referring to FIG. 21(b), in order to observe Co 2p within the material film according to Example 1-2 (1:6 Ann) and the material film according to Comparative Example 1-2 (1:6 As-dep), the XPS analysis was performed and shown.

Figure 21:
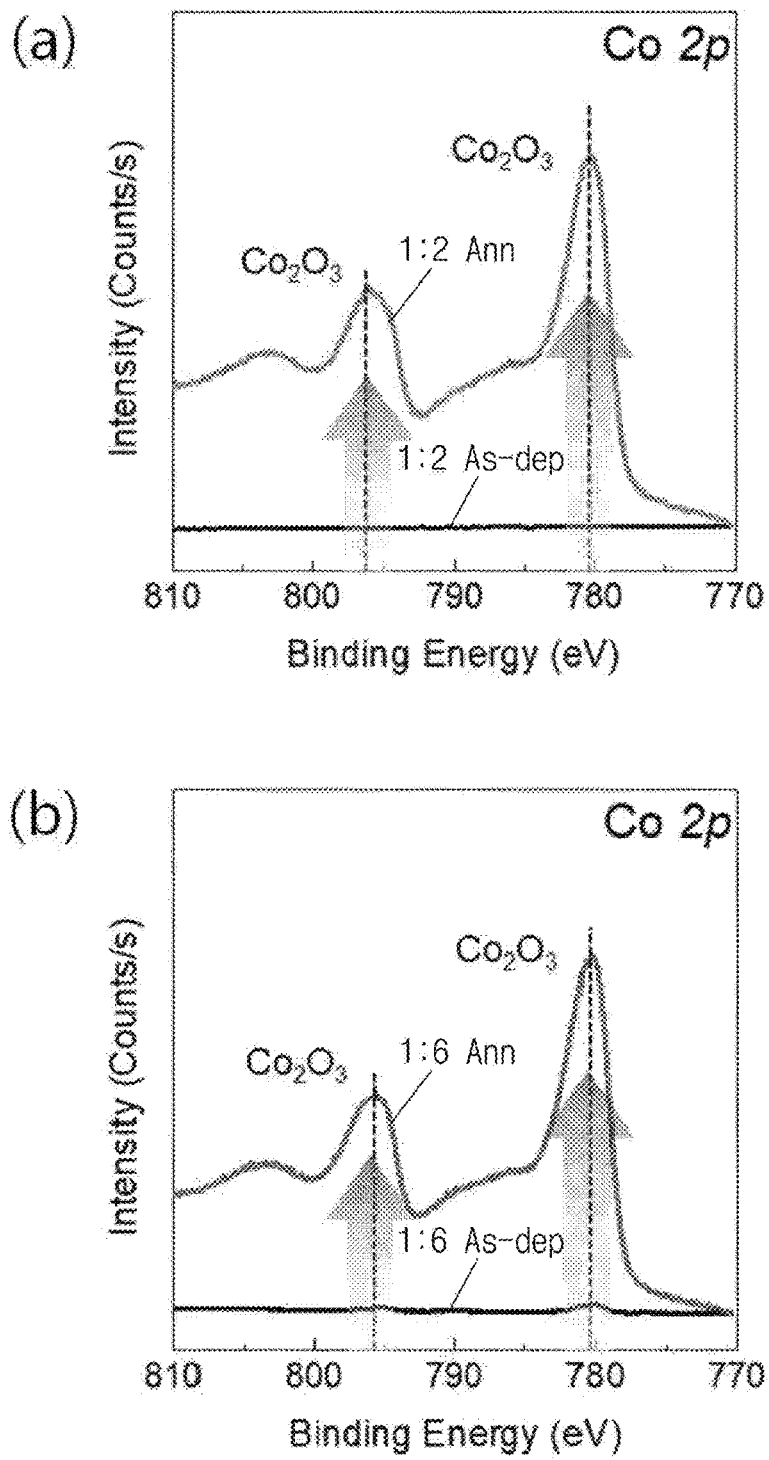

As shown in FIGS. 20 and 21, it was found that the $Li_2CO_3$ peak is observed without a Co 3p peak in the material films according to Comparative Examples 1-1 and 1-2 that are not annealed. On the contrary, it was found that the $Li_2CO_3$ peak disappears while the Co 3p peak appears in the material films according to Examples 1-1 and 1-2 that are annealed.

Figure 22:
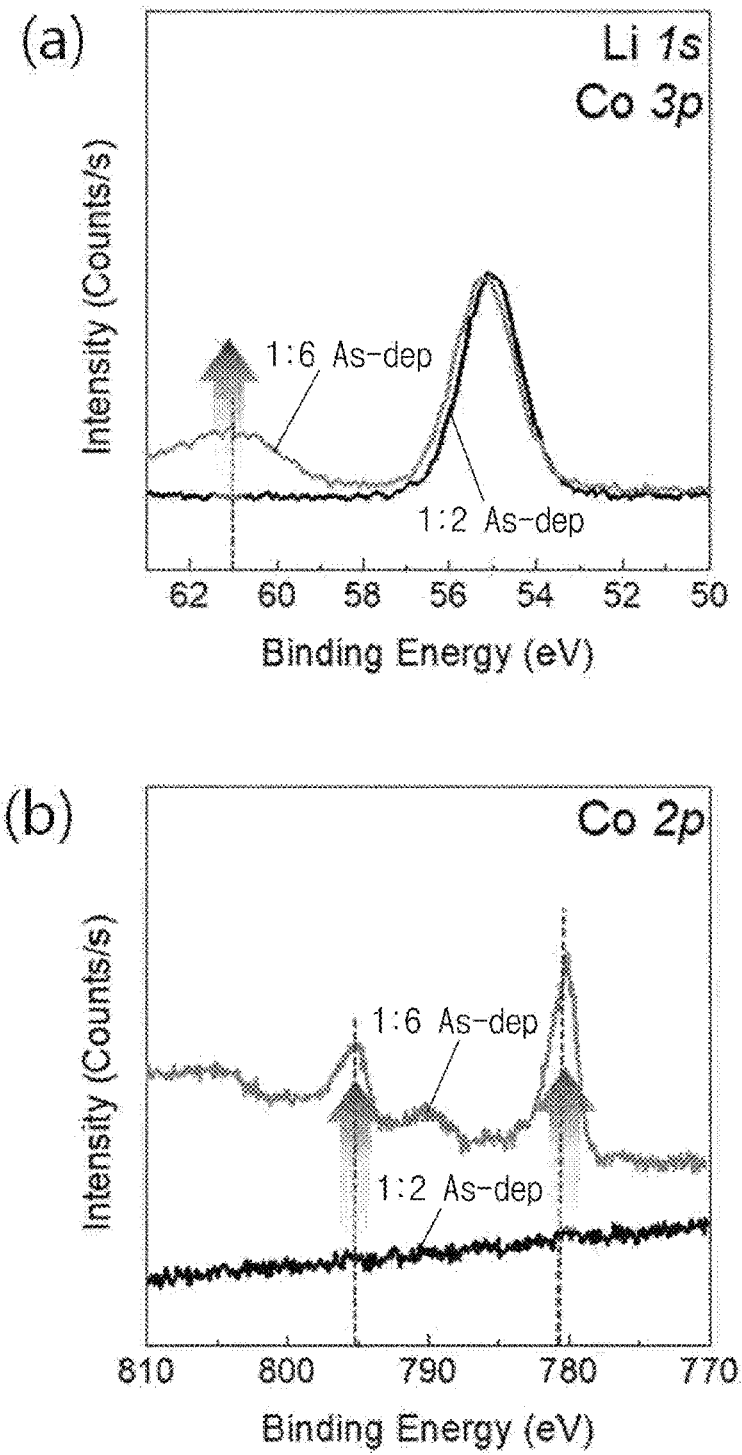
FIGS. 22 and 23 are XPS graphs for comparing compositions of material film according to a proportion of a second unit process.
Figure 23:
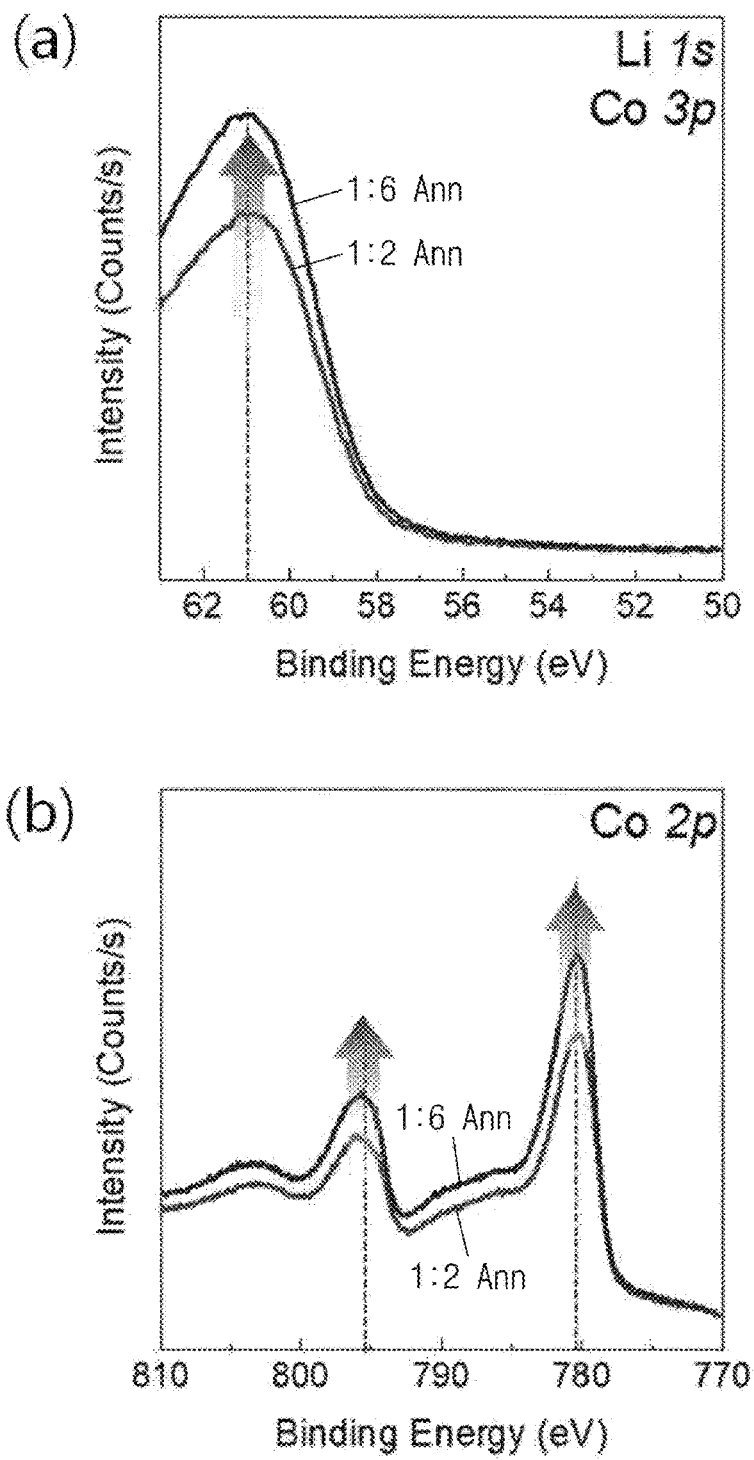

FIGS. 22 and 23 are XPS graphs for comparing compositions of material film according to a proportion of a second unit process.

Referring to FIG. 22(a), in order to observe Li 1s and Co 3p within the material film according to Comparative Example 1-1 (1:2 As-dep) and the material film according to Comparative Example 1-2 (1:6 As-dep), X-ray photoelectron spectroscopy (XPS) analysis was performed and shown. Referring to FIG. 22(b), in order to observe Co 2p within the material film according to Comparative Example 1-1 (1:2 As-dep) and the material film according to Comparative Example 1-2 (1:6 As-dep), X-ray photoelectron spectroscopy (XPS) analysis was performed and shown.

Referring to FIG. 23(a), in order to observe Li 1s and Co 3p within the material film according to Example 1-1 (1:2 Ann) and the material film according to Example 1-2 (1:6 Ann), the XPS analysis was performed and shown. Referring to FIG. 23(b), in order to observe Co 2p within the material film according to Example 1-1 (1:2 Ann) and the material film according to Example 1-2 (1:6 Ann), the XPS analysis was performed and shown.

As shown in FIGS. 22 and 23, it was found that as a proportion of the second unit process (Co cycle process) increases, intensity of Co 2p and intensity of Co 3p increase.

Preparation of Material Film According to Example 2

A material film was prepared by performing a first unit process including LiHMDS provision step—purge step—H$_2$O provision step—purge step, a second unit process including a TEMAZr provision step—purge step—H$_2$O provision step—purge step, and a third unit process including a LaFAMD provision step—purge step—H$_2$O provision step—purge step on a SiO$_2$ substrate. Thereafter, the material film was covered with a green sheet prepared by coating a film with a bulk positive electrode material (LiCoO$_2$), and the material film was annealed, so that a material film according to Example 2 was prepared.

Preparation of Material Film According to Example 2-1

A material film according to Example 2-1 was prepared by controlling a ratio of the first unit process:the second unit process:the third unit process to be 6:1:2 and controlling an annealing temperature to be 600° C. while preparing the material film according to Example 2.

Preparation of Material Film According to Example 2-2

A material film according to Example 2-2 was prepared by controlling the annealing temperature to be 300° C. while preparing the material film according to Example 2-1.

Preparation of Material Film According to Example 2-3

A material film according to Example 2-3 was prepared by controlling the ratio of the first unit process:the second unit process:the third unit process to be 8:4:1 and controlling the annealing temperature to be 600° C. while preparing the material film according to Example 2.

Preparation of Material Film According to Example 2-4

A material film according to Example 2-4 was prepared by controlling the annealing temperature to be 300° C. while preparing the material film according to Example 2-3.

Preparation of Material Film According to Example 2-5

A material film according to Example 2-5 was prepared by controlling the ratio of the first unit process:the second unit process:the third unit process to be 14:4:1 and controlling the annealing temperature to be 600° C. while preparing the material film according to Example 2.

Preparation of Material Film According to Example 2-6

A material film according to Example 2-6 was prepared by controlling the annealing temperature to be 300° C. while preparing the material film according to Example 2-5.

Preparation of Material Film According to Example 2-7

A material film according to Example 2-7 was prepared by controlling the ratio of the first unit process:the second unit process:the third unit process to be 20:4:1 and controlling the annealing temperature to be 600° C. while preparing the material film according to Example 2.

Preparation of Material Film According to Example 2-8

A material film according to Example 2-8 was prepared by controlling the annealing temperature to be 300° C. while preparing the material film according to Example 2-7.

Preparation of Material Film According to Comparative Example 2

A material film according to Comparative Example 2 was prepared by not performing the annealing while preparing the material film according to Example 2-1.

The material films according to Example 2 and Comparative Example 2 may be summarized in Table 2 below.

TABLE 2

| Classification | Precursor Metal | Process Ratio | Annealing |
|---|---|---|---|
| Example 2-1 | Li—Zr—La | 6:1:2 | 600° C. |
| Example 2-2 | Li—Zr—La | 6:1:2 | 300° C. |
| Example 2-3 | Li—Zr—La | 8:4:1 | 600° C. |
| Example 2-4 | Li—Zr—La | 8:4:1 | 300° C. |
| Example 2-5 | Li—Zr—La | 14:4:1 | 600° C. |
| Example 2-6 | Li—Zr—La | 14:4:1 | 300° C. |
| Example 2-7 | Li—Zr—La | 20:4:1 | 600° C. |
| Example 2-8 | Li—Zr—La | 20:4:1 | 300° C. |
| Comparative Example 2 | Li—Zr—La | 6:1:2 | X |

Figure 25:
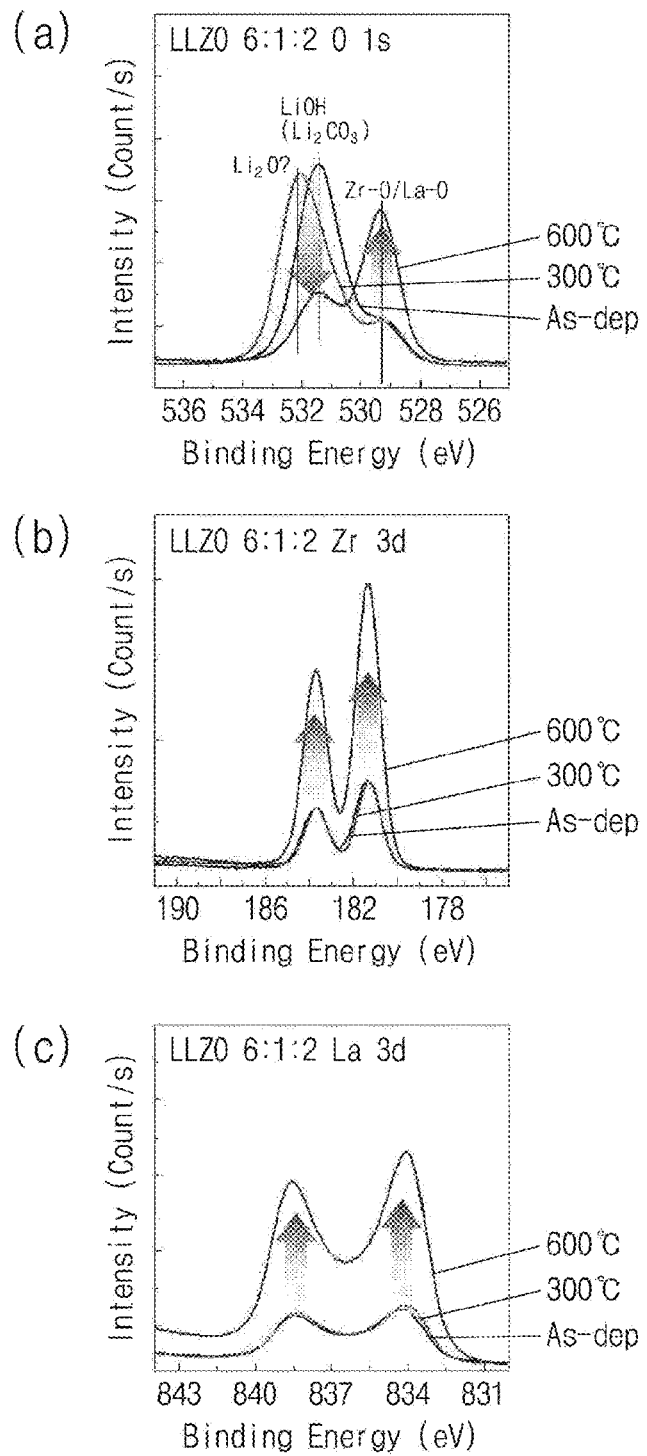

FIGS. 24 and 25 are XPS graphs for comparing compositions of material films according to Example 2 and Comparative Example 2 of the present invention.

Referring to FIGS. 24(a) and 24(b), in order to observe C 1s and Li 1s within the material film according to Example 2-1 (600° C.), the material film according to Example 2-2 (300° C.), and the material film according to Comparative Example 2 (As-dep), the XPS analysis was performed and shown.

Referring to FIGS. 25(a) to 25(c), in order to observe O 1s, Zr 3d, and La 3d within the material film according to Example 2-1 (600° C.), the material film according to Example 2-2 (300° C.), and the material film according to Comparative Example 2 (As-dep), the XPS analysis was performed and shown.

As shown in FIGS. 24 and 25, it was found that O 1s and Li 1s peaks are shifted in the material film according to Example 2-2 that is annealed at a temperature of 300° C. Accordingly, it may be understood that Li$_2$O may be formed in the material film according to Example 2-2 that is annealed at the temperature of 300° C. In addition, it was found that carbonate and Li peaks are significantly reduced in the material film according to Example 2-1 that is annealed at a temperature of 600° C. as compared with the material film according to Comparative Example 2.

Figure 26:
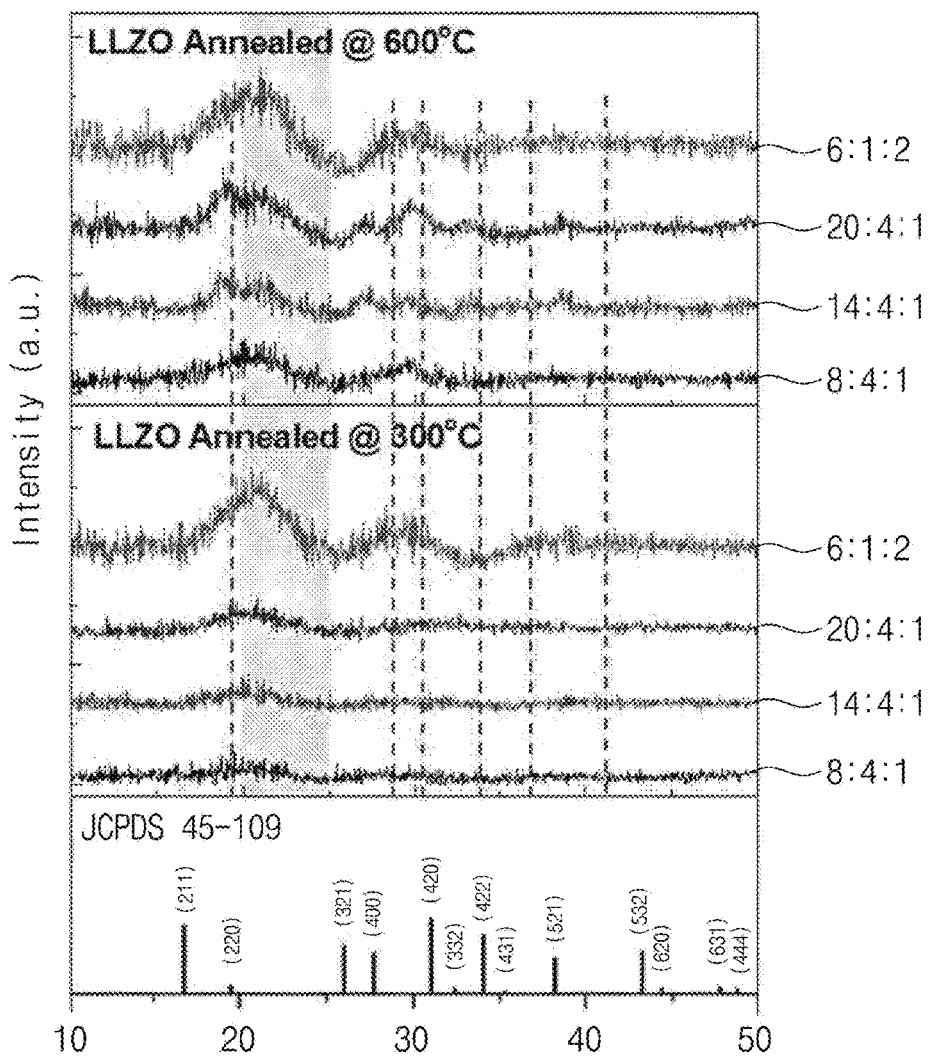
FIG. 26 is an XRD graph for comparing compositions of the material film according to Example 2 of the present invention.

FIG. 26 is an XRD graph for comparing compositions of the material film according to Example 2 of the present invention.

Referring to FIG. 26, the material films according to Examples 2-1 to 2-8 were prepared, the XRD analysis for each of the prepared material films was performed and shown. As shown in FIG. 26, it was found that as the annealing temperature increases (300° C.→600° C.), a degree of crystallization is increased.

Preparation of Material Film According to Example 3

A material film according to Example 3 was prepared by performing a first unit process including LIHMDS provision step—purge step—$H_2O$ provision step—purge step, and a second unit process including TTIP provision step—purge step—$H_2O$ provision step—purge step on a $SiO_2$ substrate.

Preparation of Material Film According to Example 3-1

A material film according to Example 3-1 was prepared by controlling a ratio of the first unit process and the second unit process to be 1:2 while preparing the material film according to Example 3.

Preparation of Material Film According to Example 3-2

A material film according to Example 3-2 was prepared by controlling the ratio of the first unit process and the second unit process to be 3:1 while preparing the material film according to Example 3.

Preparation of Material Film According to Example 3-3

A material film according to Example 3-3 was prepared by controlling the ratio of the first unit process and the second unit process to be 3:2 while preparing the material film according to Example 3.

Preparation of Material Film According to Comparative Example 3

A $TiO_2$ thin film was prepared by performing TTIP provision step—purge step—$H_2O$ provision step—purge step on the $SiO_2$ substrate.

The material films according to Example 3 and Comparative Example 3 may be summarized in Table 3 below.

TABLE 3

| Classification | Precursor Metal | Process Ratio |
|---|---|---|
| Example 3-1 | Li—Ti | 1:2 |
| Example 3-2 | Li—Ti | 3:1 |
| Example 3-3 | Li—Ti | 3:2 |
| Comparative Example 3 | Ti | X |

FIGS. 27 and 28 are graphs for comparing deposition rates of material films according to Example 3 and Comparative Example 3 of the present invention.

Referring to FIG. 27(a), a deposition rate of the material film according to Comparative Example 3 was measured and shown. Referring to FIG. 27(b), a deposition rate of the material film according to Example 3-1 was measured and shown. Referring to FIG. 28(a), a deposition rate of the material film according to Example 3-3 was measured and shown. Referring to FIG. 28(b), a deposition rate of the material film according to Example 3-2 was measured and shown.

As shown in FIGS. 27 and 28, it was found that the material film according to Comparative Example 3 exhibits a deposition rate of about 0.3 A/cycle, the material film according to Example 3-1 exhibits a deposition rate of 1.22 A/cycle, the material film according to Example 3-2 exhibits a deposition rate of 1.15 A/cycle, and the material film according to Example 3-3 exhibits a deposition rate of 0.58 A/cycle.

Figure 29:
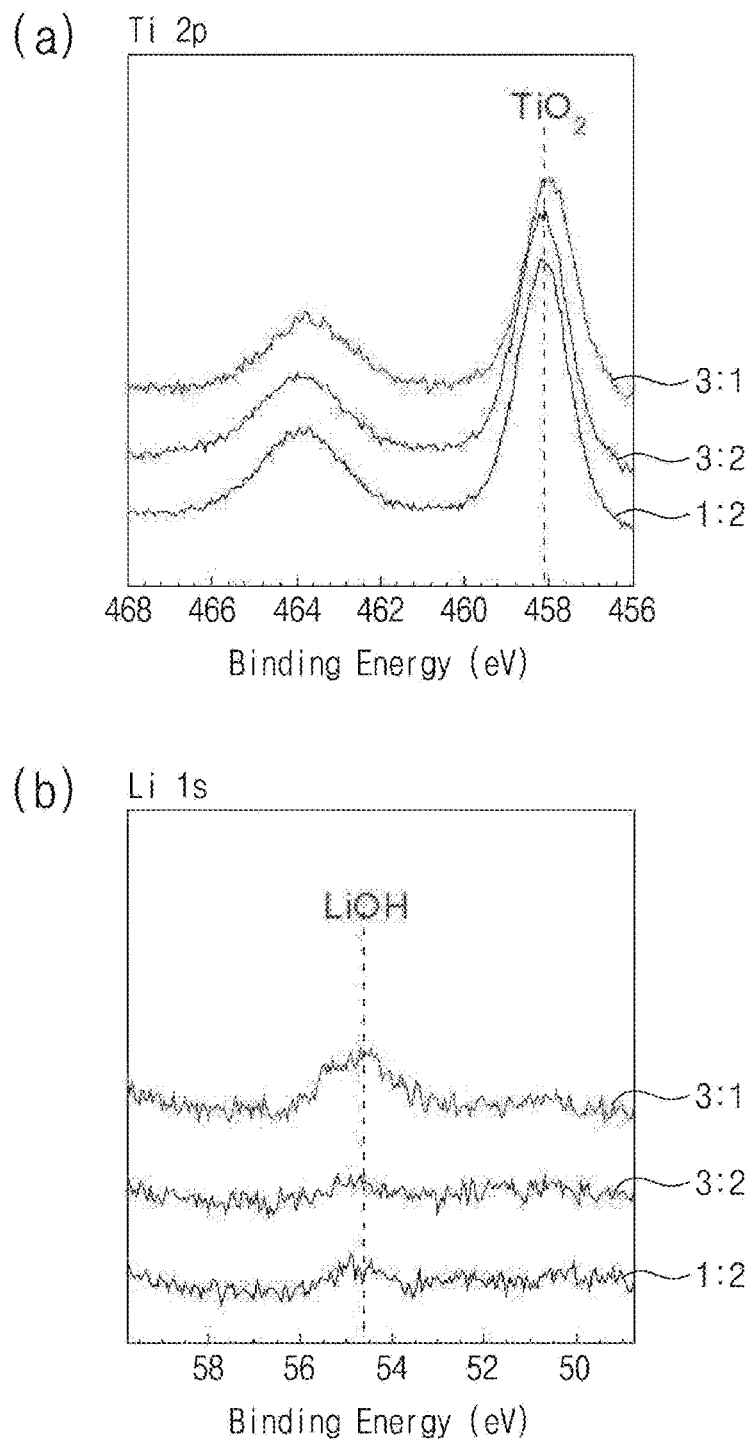

FIGS. 29 and 30 are XPS graphs for comparing compositions of material films according to Examples 3-1 to 3-3 of the present invention.

Referring to FIGS. 29(a) and 29(b), in order to observe Ti 2p and Li 1s within the material film according to Example 3-1 (1:2), the material film according to Example 3-2 (3:1), and the material film according to Example 3-3 (3:2), the XPS analysis was performed and shown.

Referring to FIGS. 30(a) and 30(b), in order to observe C 1s and O 1s within the material film according to Example 3-1 (1:2), the material film according to Example 3-2 (3:1), and the material film according to Example 3-3 (3:2), the XPS analysis was performed and shown.

As shown in FIGS. 29 and 30, it was found that $TiO_2$ and LiOH bonds are present in the material films according to Examples 3-1 to 3-3.

Figure 31:
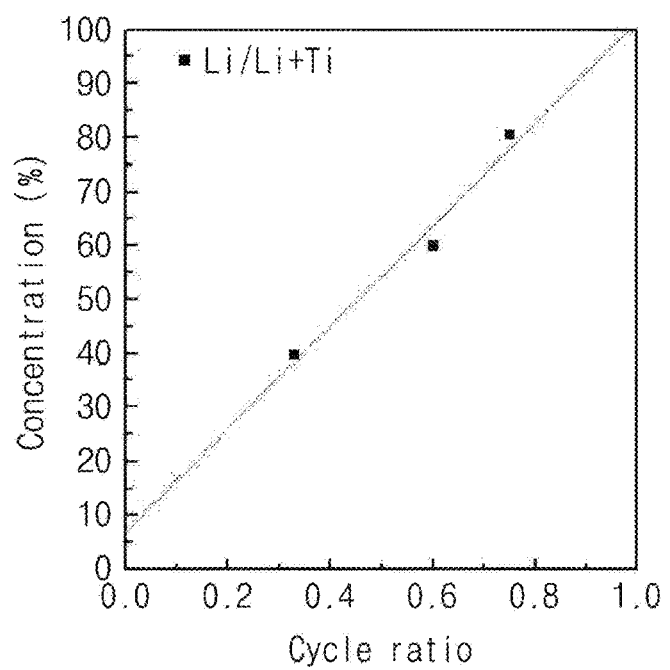
FIG. 31 is a graph showing a lithium composition inside the material film according to Example 3 of the present invention.

FIG. 31 is a graph showing a lithium composition inside the material film according to Example 3 of the present invention.

Referring to FIG. 31, a ratio (cycle ratio) of the first unit process and the second unit process was controlled while preparing the material film according to Example 3, and a concentration of lithium (Li) within the material film at the controlled ratio was measured and shown. As shown in FIG. 31, it was found that as a proportion of LiOH increases, a content of lithium is increased in the material film according to Example 3.

Although the exemplary embodiments of the present invention have been described in detail, the scope of the present invention is not limited to a specific embodiment, and should be interpreted by the appended claims. In addition, it should be understood by those of ordinary skill in the art that various changes and modifications can be made without departing from the scope of the present invention.

INDUSTRIAL APPLICABILITY

The electrode structure and the manufacturing method thereof according to the embodiment of the present invention may be applied to a secondary battery.

SEQUENCE LIST FREE TEXT

100: Base substrate
200: Amorphous seed layer
300: Crystalline seed layer
400: Functional film

The invention claimed is:
1. A method of manufacturing an electrode structure, the method comprising:
preparing a base substrate;
forming an amorphous seed layer covering the base substrate;
crystallizing the amorphous seed layer to produce a crystallized seed layer;

providing a first reducing metal precursor on the crystallized seed layer to remove a first native oxide film formed on the crystallized seed layer; and after providing the first reducing metal precursor on the crystallized seed layer, forming a functional film for a secondary battery, which covers the crystallized seed layer and has a crystalline structure.

2. The method of claim 1, wherein, after preparing the base substrate and before forming the amorphous seed layer, the method further comprises providing a second reducing metal precursor on the base substrate to remove a second native oxide film formed on the base substrate.

3. The method of claim 2, wherein a reducing metal of the second reducing metal precursor remains on a surface of the base substrate from which the second native oxide film is removed.

4. The method of claim 1, wherein the first reducing metal precursor remains on a surface of the crystallized seed layer from which the first native oxide film is removed.

5. The method of claim 2, wherein the second reducing metal precursor includes trimethylaluminum (TMA).

6. The method of claim 1, wherein
crystallizing the amorphous seed layer includes:
covering the amorphous seed layer with a barrier sheet, and
annealing the amorphous seed layer covered with the barrier sheet, and
the barrier sheet is configured to reduce a leakage of a metal inside the amorphous seed layer to an outside of the amorphous seed layer while annealing the amorphous seed layer.

7. The method of claim 1, wherein
forming the amorphous seed layer is performed in a chamber, and crystallizing the amorphous seed layer is performed in a furnace,
a native by-product layer is formed on the amorphous seed layer in a process of transferring the amorphous seed layer from the chamber to the furnace, and
the native by-product layer is removed as the amorphous seed layer is crystallized.

8. The method of claim 7, wherein the native by-product layer includes a compound of a metal, carbon, and oxygen.

9. The method of claim 1, wherein forming the amorphous seed layer includes:
providing a first precursor including a first metal on the base substrate, and providing a first reaction source on the base substrate on which the first precursor is provided to form a first seed layer obtained by allowing the first precursor and the first reaction source to react with each other; and
providing a second precursor including a second metal on the first seed layer, and providing a second reaction source on the first seed layer on which the second precursor is provided to form a second seed layer obtained by allowing the second precursor and the second reaction source to react with each other.

10. The method of claim 9, wherein each of the first metal and the second metal includes one of lithium (Li), cobalt (Co), lanthanum (La), zirconium (Zr), or titanium (Ti).

11. The method of claim 1, wherein the first reducing metal precursor includes trimethylaluminum (TMA).

12. The method of claim 1, wherein a reducing metal of the first reducing metal precursor remains on a surface of the crystallized seed layer from which the first native oxide film is removed.

* * * * *